(12) United States Patent
Fuhrmann et al.

(10) Patent No.: US 8,445,697 B2
(45) Date of Patent: *May 21, 2013

(54) SQUARYLIUM DYES INCLUDING AN ANCHORING GROUP

(75) Inventors: Gerda Fuhrmann, Stuttgart (DE); Gabriele Nelles, Stuttgart (DE); Ameneh Bamedi Zilai, Stuttgart (DE); Akio Yasuda, Stuttgart (DE)

(73) Assignee: Sony Corporation, Tokyo (JP)

( * ) Notice: Subject to any disclaimer, the term of this patent is extended or adjusted under 35 U.S.C. 154(b) by 263 days.

This patent is subject to a terminal disclaimer.

(21) Appl. No.: 12/739,573

(22) PCT Filed: Oct. 27, 2008

(86) PCT No.: PCT/EP2008/009074
§ 371 (c)(1),
(2), (4) Date: Apr. 23, 2010

(87) PCT Pub. No.: WO2009/053107
PCT Pub. Date: Apr. 30, 2009

(65) Prior Publication Data
US 2010/0300521 A1    Dec. 2, 2010

(30) Foreign Application Priority Data

Oct. 25, 2007  (EP) .................................. 07020925
Apr. 23, 2008  (EP) .................................. 08007856

(51) Int. Cl.
| C07F 9/02 | (2006.01) |
| C07F 9/547 | (2006.01) |
| C07D 209/02 | (2006.01) |
| C07D 209/04 | (2006.01) |
| C07D 209/12 | (2006.01) |
| C07D 209/14 | (2006.01) |
| C07D 209/18 | (2006.01) |
| C08K 5/00 | (2006.01) |

(52) U.S. Cl.
USPC ........... 548/414; 548/455; 548/469; 548/494; 548/503; 548/509; 106/506; 568/381

(58) Field of Classification Search
USPC .. 548/414, 455, 469, 494, 503, 509; 106/506; 568/381
See application file for complete search history.

(56) References Cited

U.S. PATENT DOCUMENTS

| 6,335,481 B1 | 1/2002 | Watanabe |
| 6,403,807 B1 * | 6/2002 | Singh et al. .................. 548/455 |
| 2004/0099306 A1 | 5/2004 | Hara et al. |

FOREIGN PATENT DOCUMENTS

| EP | 1 311 001 | 5/2003 |
| EP | 1 628 356 | 2/2006 |

OTHER PUBLICATIONS

U.S. Appl. No. 13/123,344, filed Apr. 8, 2011, Fuhrmann, et al.
U.S. Appl. No. 12/738,703, filed Apr. 19, 2010, Fuhrmann, et al.
Sayama, K. et al., "Efficient Sensitization of Nanocrystalline TiO2 Films With Cyanine and Merocyanine Organic Dyes", Solar Energy Materials and Solar Cells, vol. 80, pp. 47-71, (Oct. 15, 2003) XP004456743.
Zhao, W. et al., "Study on Squarylium Cyanine Dyes for Photoelectric Conversion", Solar Energy Materials and Solar Cells, vol. 58, pp. 173-183 (Jan. 6, 1999) XP004177953.
Reis, L.V. et al., "New Synthetic Approach to Aminosquarylium Cyanine Dyes", Letter, Synlett, No. X, pp. 1-4 (Jan. 1, 2002) XP 002499262.
Hara, K. et al., "Design of New Coumarin Dyes Having Thiophene Moieties for Highly Efficient Organic-DYE-Sensitized Solar Cells", New Journal of Chemistry, vol. 27, pp. 783-785 (Jan. 1, 2003), XP 008023573.
Hara, K. et al., "Novel Conjugated Organic Dyes for Efficient Dye-Sensitized Solar Cells", Adv.Funct Mater, vol. 15, No. 2, pp. 246-252 (Feb. 2005) XP001225432.
Hara, K. et al., "Oligothiophene-Containing Coumarin Dyes for Efficient Dye-Sensitized Solar Cells", J.Phys. Chem. vol. 109, pp. 15476-15482 (2005) XP002465986.

* cited by examiner

*Primary Examiner* — Nathan M Nutter
(74) *Attorney, Agent, or Firm* — Oblon, Spivak, McClelland, Maier & Neustadt, L.L.P.

(57) ABSTRACT

The present invention relates to squarylium dyes including an anchoring group, to a method of synthesis of such dye, to an electronic device comprising such dye, and to uses of such dye.

17 Claims, 14 Drawing Sheets

SQUARYLIUM DYES INCLUDING AN ANCHORING GROUP

The present invention relates to squarylium dyes including an anchoring group in their structure, to a method of synthesis of such dyes, to an electronic device comprising such dyes, and to uses of such dyes.

The dye-sensitised solar cell (DSSC) (B. O'Regan and M. Grätzel, Nature 353 (1991) 737; WO 91/16719 [A]) is a photovoltaic device that offers high energy-conversion efficiencies at low cost. In contrast to the silicon-based systems, where the semiconductor assumes both the task of light absorption and charge carrier transport, in DSSCs these functions are separated. Light is absorbed by a sensitizer dye which is anchored to the surface of a semiconductor such as nanocrystalline $TiO_2$. The charge separation takes place at the interface via photo-induced electron injection from the dye into the conduction band of the semiconductor. The dye molecule is regenerated from a counter electrode via a redox couple in the electrolyte. The redox couple is regenerated in turn at the counter-electrode the circuit being completed by electron transport through the external load.

The efficiency of a DSSC is determined by the number of collected and injected photons, and thus by the light absorbed by the dye sensitizer. For high efficiencies, the ideal sensitizer should absorb efficiently over a broad range of solar spectrum. In addition, for efficient electron injection it must be able to adsorb (by chemisorption) onto the semiconductor surface. Upon photo-excitation it should inject electrons into the conduction band of the semiconductor with a quantum yield of unity. To minimize energy losses during electron transfer, the energy level of its excited state should be well matched with the lower bound of the conduction band of the semiconductor. Its redox potential should be well matched with that of the redox couple so that the dye regeneration via electron donation is possible.

The best photovoltaic performance has so far been achieved with carboxyl groups containing polypyridyl complexes of ruthenium (known as red-dye and black-dye). [1] The photoexcitation of a Ru-complex results in an intramolecular metal-to-ligand charge-transfer (MLCT) transition. The photoexcited electrons located in the bipyridyl ligands can be very efficiently injected in the conduction band of the semiconductor via the carboxyl-anchor groups. This process has been shown to be very fast. [2] In contrast, for these complexes the recombination process between the injected electrons in $TiO_2$ and the dye-cations is a slow process. The slow recombination is considered to be a result of the large separation between semiconductor and the $Ru^{3+}$ by the bipyridyl ligands. Thus, the molecular design of these Ru-complexes is successful in an efficient charge separation and thus, high energy conversion efficiency.

However, the energy conversion efficiency of the DSSC is limited by the light-harvesting capacity of these Ru-dyes to absorb the sunlight. The photo-active region of the photovoltaic device is reduced to the visible part of the solar spectrum, and within that, to the shorter wavelength region. The photons of the longer wavelength region are not harvested and cannot be converted to electrical energy.

To improve the overall light to electricity conversion efficiency of a solar cell the photo-response has to be extended in the longer wavelength region of the solar spectrum. Thus, new dyes with absorption bands above 600 nm are required. The synthetic modification of the commonly employed ruthenium complexes towards this goal is limited.

It is therefore desirable to develop new organic dyes which have several advantages as photo-sensitizers: a) they have intense absorption (high extinction coefficients 10-100 higher than Ru-complexes), such that little material is needed for harvesting lot of light; b) their physical properties are amenable to being modified/tuned by chemical structural modification; c) they are cheaper since they don't contain metals, such as ruthenium.

However, to achieve as high efficiencies with organic dyes as achieved with polypyridyl Ru-complexes, sophisticated molecular design as described above for the Ru-complexes is required. Although, many organic dyes such as coumarin, merocyanine and polyene dyes have already been developed for DSSCs, most dyes reported so far absorb light in the same range as the commonly used red-dye (below 600 nm). [3] Thus, photons of the longer wavelength region are still lost to photoconversion.

Accordingly, it was an object of the present invention to provide for new dyes to be used in dye-sensitized solar cells. Moreover, it was an object of the present invention to provide for easy accessible, stable and soluble functional materials with intense absorption in the visible and long wavelength region of the solar spectrum. Moreover, it was an object of the present invention to provide for photostable dyes which have intense absorption with absorption coefficients >$10^5$ L $mol^{-1}$ $cm^{-1}$ in the visible and IR-region of the solar spectrum. It was also an object of the present invention to provide for dyes which may be combined with other dyes so as to cover a broad range of the solar spectrum and thereby collect light over a broad range thereof. Moreover, it was an object of the present invention to provide for dyes whose band-gap and energy levels can be tuned and which can be efficiently chemisorbed to the nanoporous surface of a photoactive layer. It was also an object of the present invention to provide for an improved dye to be used in dye-sensitized solar cells.

Noticeable is the fact that there are some organic dyes with good efficiencies reported that have an acrylic acid group attached. [5] However, as said before, they absorb light only in the range of the red dye. The dyes reported in the present application are capable to absorb the light also in the longer wavelength region.

The objects of the present invention are solved by a dye represented by formula I

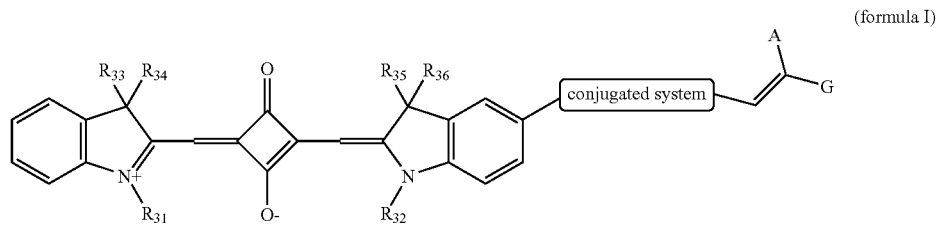

(formula I)

G being an anchoring group, said anchoring group allowing a covalent coupling of said dye to a surface, for example a surface of a nanoporous semiconductor layer, said anchoring group being selected from —COOH, —SO$_3$H, —PO$_3$H$_2$, —BO$_2$H$_2$, —SH, —OH, —NH$_2$, preferably —COOH, wherein A is selected from the group comprising H, —CN, —NO$_2$, —COOR, —COSR, —COR, —CSR, —NCS, —CF$_3$, —CONR$_2$, —OCF$_3$, C$_6$H$_{5-m}$F$_m$, wherein m=1-5, preferably —CN or —CF$_3$, R being H or any straight or branched alkyl chain of general formula —C$_n$H2$_{n+1}$, n=0-12, preferably 0-4, wherein R$_{31}$, R$_{32}$, R$_{33}$, R$_{34}$, R$_{35}$, R$_{36}$, at each occurrence, are independently selected from H or any straight or branched chain of general formula —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, n=0-12, preferably 0-6, and p=1-4, R being as defined above, or any substituted or non-substituted phenyl or biphenyl, wherein said conjugated system is represented by a moiety shown in formula II (formula II)

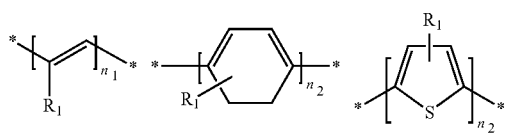

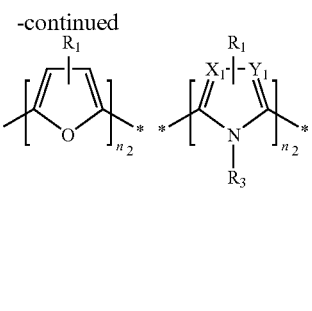

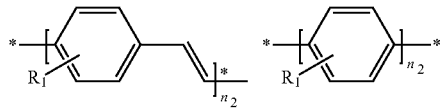

or a combination of any of the moieties represented by formula II, wherein n$_1$ and n$_2$=0-12, preferably n$_1$=0-3 and n$_2$=1-7, wherein R$_3$ is selected from H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, p=1-4, n=0-12, R being as defined above, and wherein R$_1$ is selected from halogen, such as Cl, Br, F, I, or NO$_2$, NH$_2$, CN, SO$_3$H, OH, H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, p=1-4, n=0-12, R being as defined above.

In one embodiment the dye according to the present invention is able to absorb in the wave-length range of visible and/or IR light, preferably in the range from 300-1200 nm, or a subrange thereof, preferably 580-850 nm In one embodiment the dye according to the present invention has the formula III (formula III)

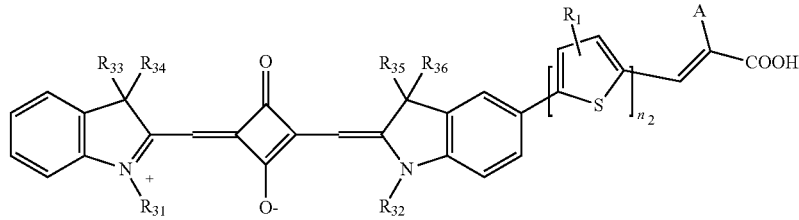

wherein R$_{31}$, R$_{32}$, R$_{33}$, R$_{34}$, R$_{35}$, R$_{36}$, at each occurrence, are independently selected from H or any straight or branched chain of general formula —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, n=0-12, preferably 0-6, and p=1-4, R being as defined above, or any substituted or non-substituted phenyl or biphenyl, A, R$_1$ and n$_2$ being as described above In one embodiment the dye according to the present invention has the formula IV (formula IV)

wherein $R_{31}$, $R_{32}$, $R_{33}$, $R_{34}$, $R_{35}$, $R_{36}$, at each occurrence, are independently selected from H or any straight or branched chain of general formula —$(CH_2)_n CH_3$, —$(CH_2)_n$—COOR, —$(CH_2)_n$—OR, —$(CH_2)_n$—SR, —$(CH_2)_n$—$NR_2$, —$((CH_2)_p$—$O)_n$—$CH_3$, $n=0-12$, preferably 0-6, and $p=1-4$, R being as defined above, or any substituted or non-substituted phenyl or biphenyl, In one embodiment the dye according to the present invention has the formula V

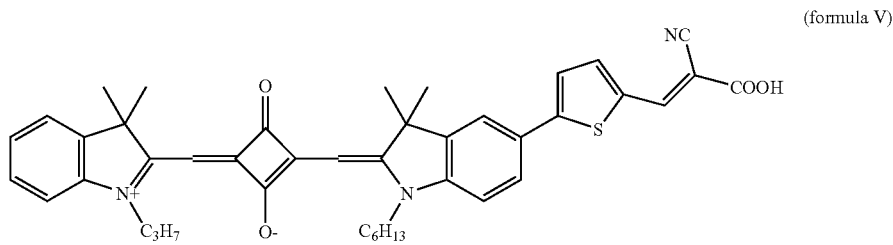

(formula V)

In one embodiment the dye according to the present invention has the formula VI

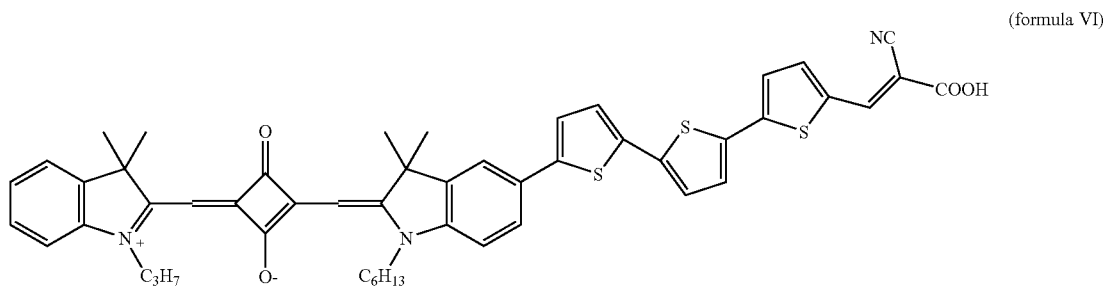

(formula VI)

In one embodiment the dye according to the present invention has the formula VII

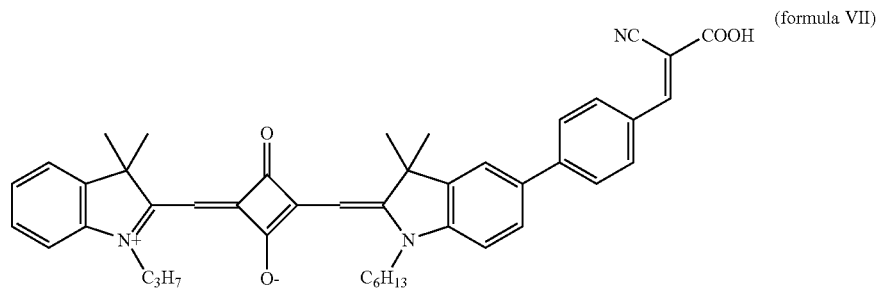

(formula VII)

The objects of the present invention are also solved by a method of synthesis of a dye according to the present invention, comprising the following steps:
a) coupling of a halogenated squarylium dye and a metalated conjugated system comprising a carboxyaldehyde moiety in its structure, as represented by scheme I (Scheme 1)

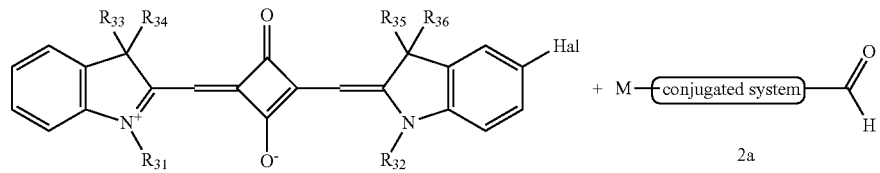

[Cat]

-continued

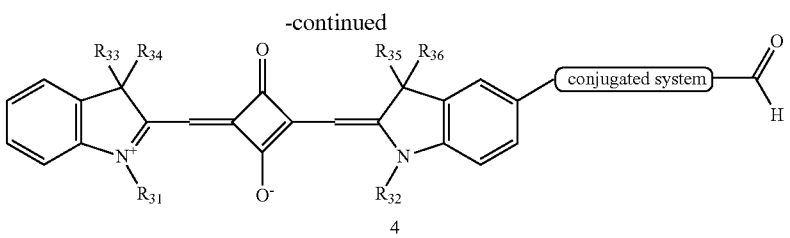

wherein
Hal=Br, I, Cl, Tosyl
M=Sn(alkyl)$_3$, B(OR)$_2$, MgHal, ZnR$_2$, R being in this case an H or any alkyl group, preferably a $C_1$-$C_{12}$ alkyl, $R_{31}$-$R_{36}$ and said conjugated system being as defined in any of claims 1-7, [Cat] representing a generally employed catalyst in such transition metal catalyzed coupling reactions, preferably palladium, nickel or copper catalyst, and wherein 1 is a halogenated squarylium dye and 2a is metalated conjugated system comprising a carboxyaldehyde moiety in its structure or coupling of a metalated squarylium dye and a halogenated conjugated system comprising a carboxyaldehyde moiety in its structure, as represented by the scheme II (scheme II)

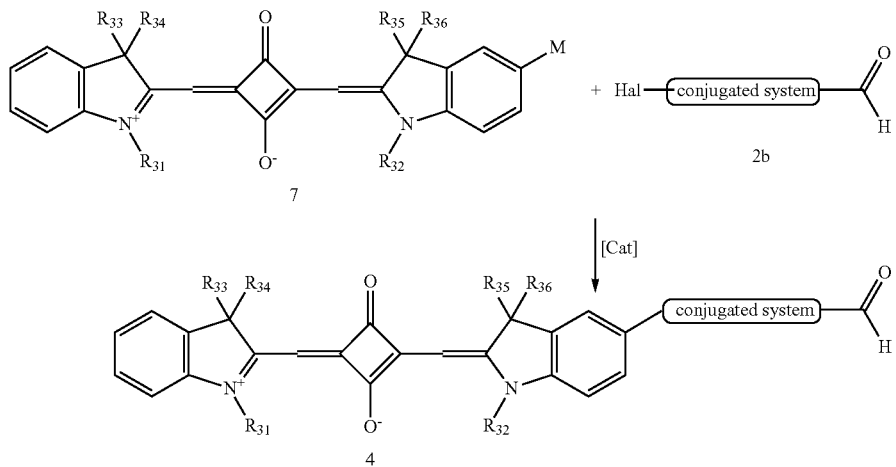

wherein
Hal=Br, I, Cl, Tosyl
M=Sn(alkyl)$_3$, B(OR)$_2$, MgHal, ZnR$_2$, R being in this case an H or any alkyl group, preferably a $C_1$-$C_{12}$ alkyl, $R_{31}$-$R_{36}$ and said conjugated system being as defined in any of claims 1-7, [Cat] representing a generally employed catalyst in such transition metal catalyzed coupling reactions, preferably palladium, nickel or copper catalyst,
and wherein 7 is a metalated squarylium dye and 2b is halogenated conjugated system comprising a carboxyaldehyde moiety in its structure,
and b) condensation reaction of the product of step a), with a reagent of general formula A-CH$_2$-G, as represented by the scheme III (Scheme III)

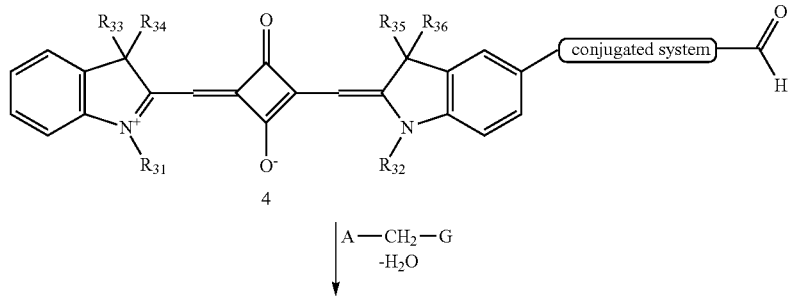

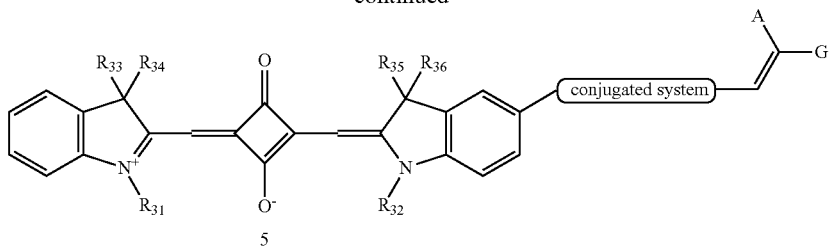

G, A, $R_{31}$-$R_{36}$ and said conjugated system being as defined above.

The objects of the present invention are also solved by a method of synthesis of a dye according to the present invention, comprising the following steps:
a) coupling of a halogenated squarylium dye and a metalated conjugated system as represented by the scheme IV (Scheme IV)

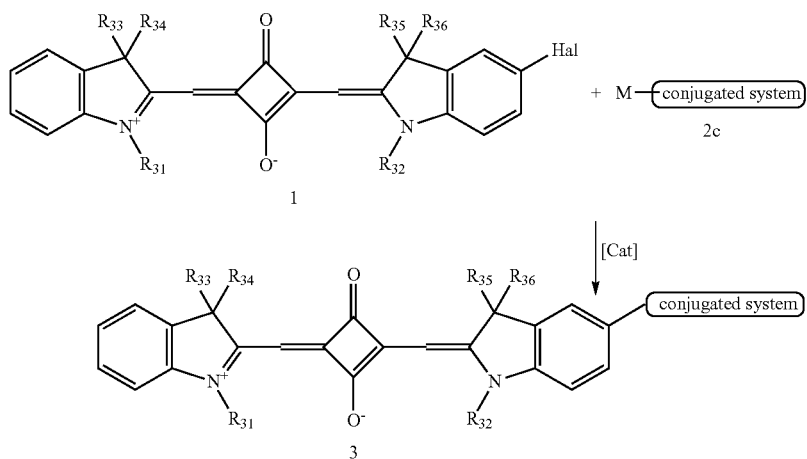

wherein
Hal=Br, I, Cl, Tosyl
M=Sn(alkyl)$_3$, B(OR)$_2$, MgHal, ZnR$_2$, R being in this case an H or any alkyl group, preferably a $C_1$-$C_{12}$ alkyl, $R_{31}$-$R_{36}$ and said conjugated system being as defined above,
[Cat] representing a generally employed catalyst in such transition metal catalyzed coupling reactions, preferably palladium, nickel or copper catalyst,
and wherein 1 is a halogenated squarylium dye and 2c is metalated conjugated system comprising a carboxyaldehyde moiety in its structure
or
coupling of a metalated squarylium dye and a halogenated conjugated system, as represented by the scheme V (Scheme V)

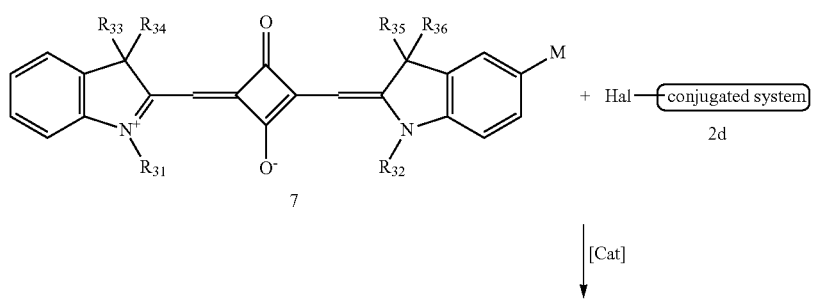

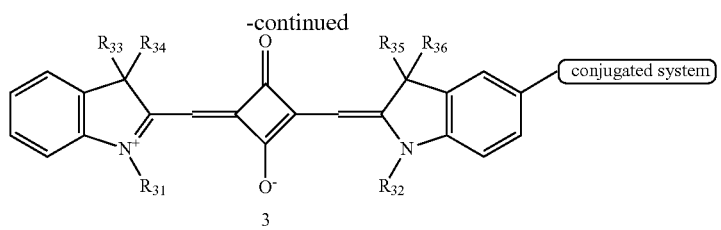

wherein
Hal=Br, I, Cl, Tosyl
M=Sn(alkyl)$_3$, B(OR)$_2$, MgHal, ZnR$_2$, R being in this case an H or any alkyl group, preferably a C$_1$-C$_{12}$ alkyl, R$_{31}$-R$_{36}$ and said conjugated system being as defined above,
[Cat] representing a generally employed catalyst in such transition metal catalyzed coupling reactions, preferably palladium, nickel or copper catalyst,
and wherein 1 is a metalated squarylium dye and 2c is halogenated conjugated system and b) introduction of a carboxyaldehyde moiety to the product of reaction a), preferably by a reaction represented by the scheme VI

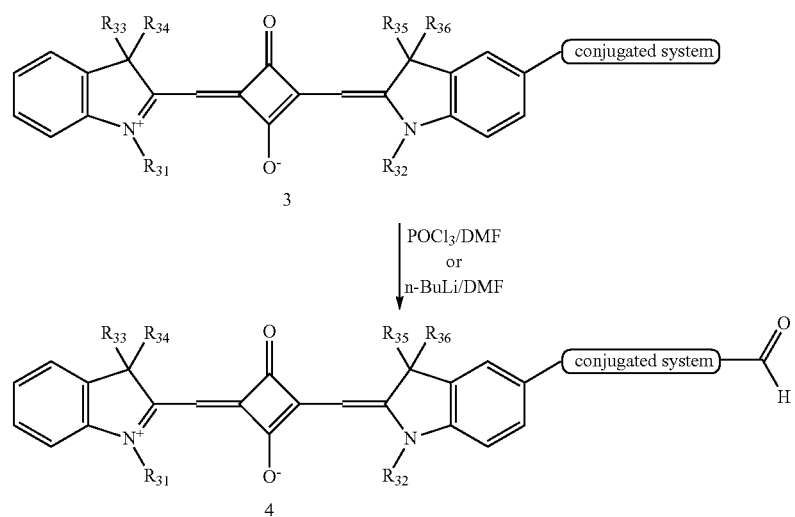

wherein G, A, R$_{31}$-R$_{36}$ and said conjugated system being as defined above,
and c) condensation reaction of the product of step b), with a reagent of general formula A-CH$_2$-G, as represented by the scheme VII

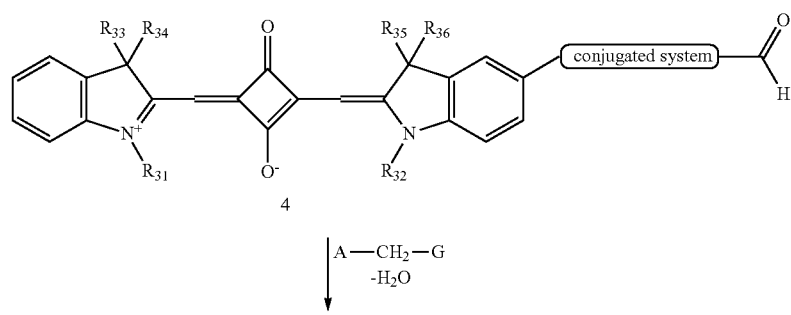

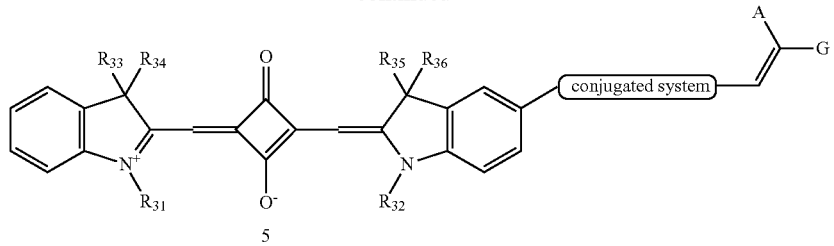

wherein G, A, $R_{31}$-$R_{36}$ and said conjugated system being as defined above.

The objects of the present invention are also solved by a method of synthesis of a halogenated squarylium dye 1 as defined above comprising the following steps:

a) formation of a halo or alkyl ester of a squaric acid derivative 1c, as represented by Scheme VIII

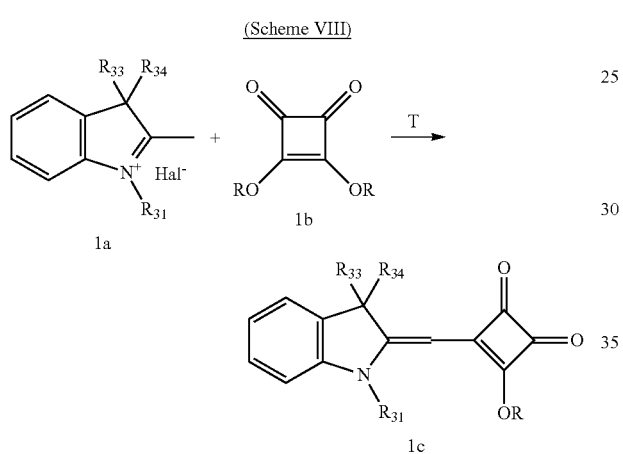

Hal=Br, I, Cl, Tosyl

R being any alkyl group, preferably a $C_1$-$C_4$ alkyl, $R_{31}$, $R_{33}$ and $R_{34}$ being as defined above, and b1) deprotection of alkyl ester to hydroxyl group, as represented by scheme IX

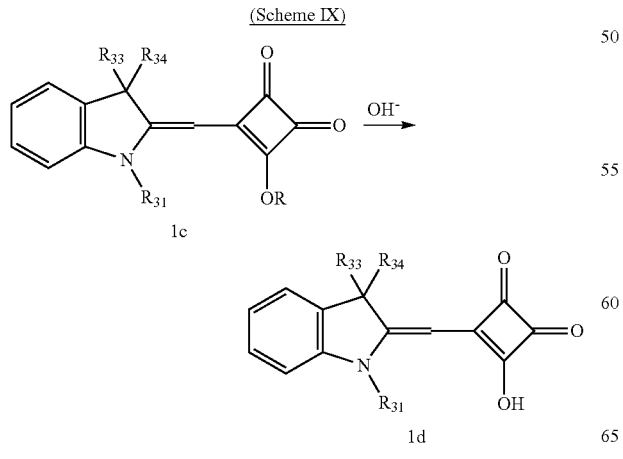

followed subsequently by a condensation reaction between intermediate 1d and compound 1e, as represented by Scheme X

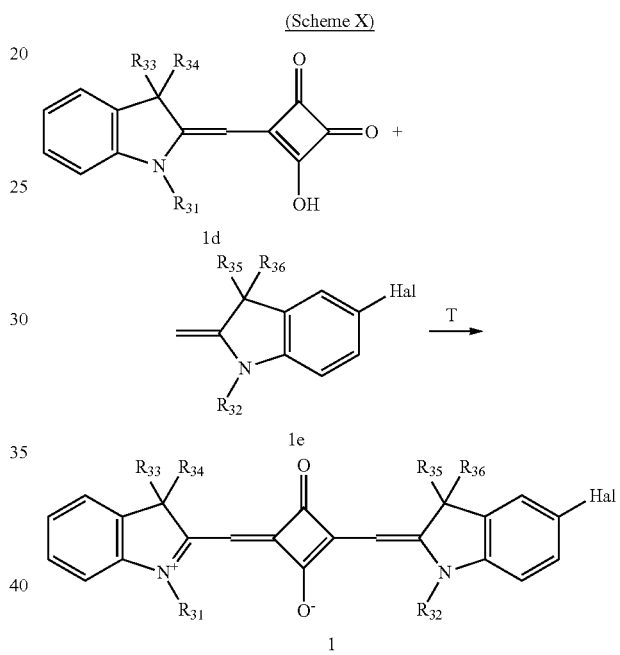

or b2) a direct reaction between product from step a) and compound 1e, as represented by Scheme XI

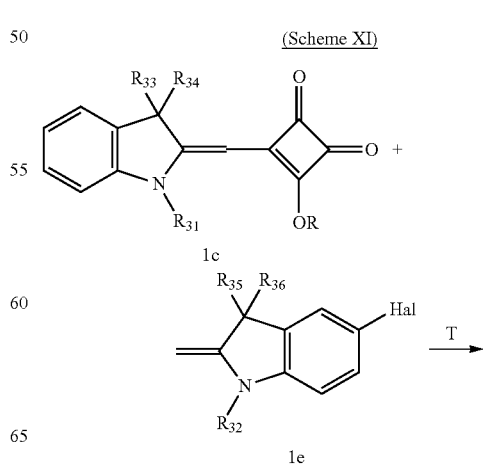

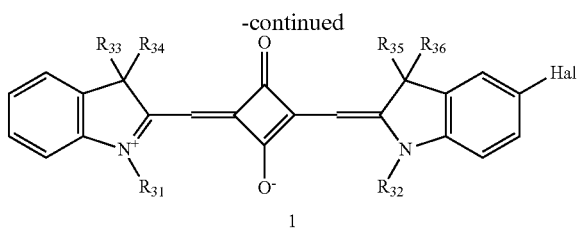

The objects of the present invention are also solved by an electronic device comprising a dye as defined above.

In one embodiment, said device is a solar cell, preferably a dye-sensitized solar cell. Examples of electronic devices comprising a dye in accordance with the present invention include energy supply devices for portable electronic devices and displays, such as solar cell panels for or incorporated in mobile phones, note books, laptops, portable audio-tape players, MP3-players, remote controls, e-cards, e-books, e-readers, portable CD players, portable DVD players, cameras, digicams, GPS devices, portable sensors, displays integrated in electronic devices. Examples of electronic devices in accordance with the present invention also include portable solar chargers for batteries of any of the aforementioned devices. Moreover, electronic devices in accordance with the present invention include smart windows, on-roof applications, especially in areas where a grid connection is not possible, e.g. camping cars, boats. If the electronic device in accordance with the present invention is an energy supply device, and said energy supply device is a solar cell panel, such panel is preferably a dye sensitized solar cell panel (DSSC panel) (see also FIG. 13).

In a preferred embodiment in the dye-sensitized solar cell, said dye is chemisorbed to a photoactive semiconductor layer.

In one embodiment the device according to the present invention, further comprises at least one other dye. Preferably, the dye in accordance with the present invention and said at least one other dye are mixed. Preferably the dye in accordance with the present invention and said at least one other dye are not on or in separate layers each, but rather being chemisorbed to one photoactive semiconductor layer.

In one embodiment said at least one other dye is red-dye or black-dye or a combination of the two.

Preferably, said dye is present in solution or said dye is present in a film.

In one embodiment the electronic device according to the present invention is a chromogenic sensor.

The objects of the present invention are also solved by the use of a dye as defined above as sensitizer in a dye-sensitized solar cell, preferably, together with at least one other dye.

In one embodiment said at least one other dye is a dye according to the present invention, as defined above, or red dye or black dye or a combination of the two.

The objects of the present invention are also solved by the use of a dye according to the present invention as a sensor, wherein, preferably, the spectral properties of said dye depend on the presence, absence or quantity of analyte present and change in accordance therewith.

In preferred embodiments, the device according the present invention comprises a semiconductor porous material, preferably with one or several of the following specifications.

- semiconductor porous material has a thickness of 10-100 nm, preferably 15-40 nm
- semiconductor porous material consist of one or more layers
- semiconductor porous material contain particles having an average diameter or length in the range of from 1 nm to 40 nm, preferably 15-30 nm
- semiconductor porous material is a mixture of more kind of particles, said one kind of particles having an average diameter or length in the range of from 1 nm to 30 nm, and said second kind of particles having an average diameter in the range of from 30 nm to 100 nm and/or length in the range of from 100 nm to 5 μm.
- semiconductor porous material can be $TiO_2$, $SnO_2$, ZnO, $Nb_2O_5$, $ZrO_2$, $CeO_2$, $WO_3$, $Cr_2O_3$, $CrO_2$, $CrO_3$, $SiO_2$, $Fe_2O_3$, CuO, $Al_2O_3$, $CuAlO_2$, $SrTiO_3$, $SrCu_2O_2$, $ZrTiO4$
- The device may possibly be a photovoltaic device containing a charge-transporting agent which can be a liquid, polymer gel based or solid state electrolyte.
- during preparation of the device, the dye molecules are adsorbed to the nanoporous particles via self-assembling out of a dye solution or a dyes-mixture solution.

The objects of the present invention are also solved by a compound represented by one of the following formulae

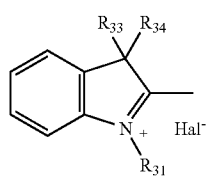

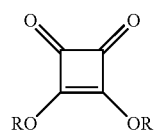

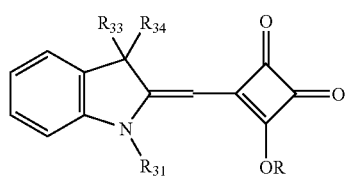

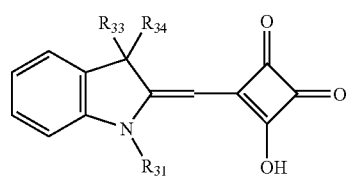

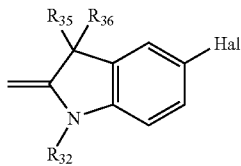

1e

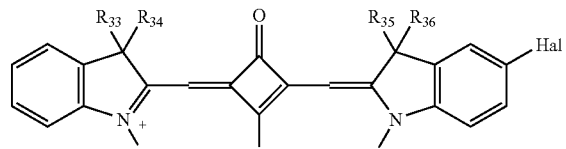

1

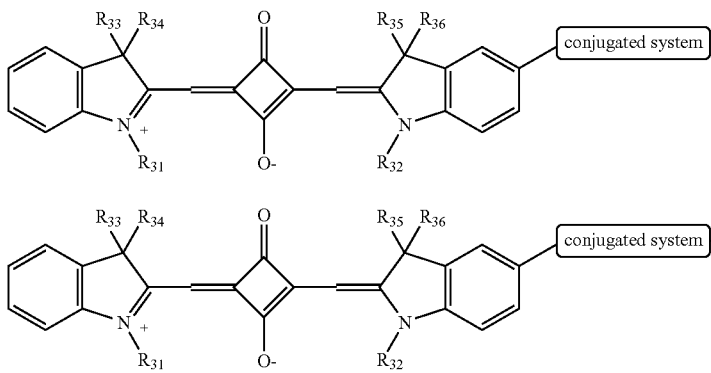

3

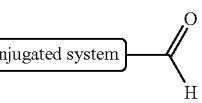

4 wherein $R_{31}$-$R_{36}$, R, Hal and said conjugated system are as defined in any of claims 7-8.

The term "anchoring group", as used herein, is meant to refer to any functional group that allows a covalent coupling (chemisorption) of the entity to which such anchoring group belongs, to a surface, for example the surface of a nanoporous semiconductor layer within a solar cell.

A "squarylium dye" is a molecule having one or several aromatic ring systems attached to a squaric acid derivative, which aromatic ring systems, if there are several such ring systems, may be identical or different.

A "conjugated system" is a molecule having alternating double bonds and single bonds between its atom centers. The simplest example of a conjugated system is butadiene wherein there are two double bonds separated by a single bond.

The term "molecular structure", as used herein, refers to the structure of a molecule. For example, the "molecular structure of a dye" is the structure of the molecule of said dye. An "anchoring group" that is included in the molecular structure of a dye forms part of said molecular structure.

A dye is referred to as being "chemisorbed" to a layer or surface, if the dye is covalently coupled thereto.

Term "red-dye" and "black-dye" refers to commonly used dyes for dye-sensitized solar cells which are cis-bis(isothiocyanato)bis(2,2'-bipyridyl-4,4'-dicarboxylato)-ruthenium (II) bistetrabutylammonium (in literature also known as Ruthenium 535-bisTBA, N719 or B2) and tris(isothiocyanato)-ruthenium(II)-2,2':6',2''-terpyridine-4,4',4''-tricarboxylic acid, tristertrabutylammonium salt (also known as Ruthenium 620-1H3TBA, Ruthenium 620 or N-749).

The term "a dye including an anchoring group in its molecular structure" as used herein, is meant to refer both to a scenario where only one anchoring group is present within the structure and a scenario wherein several anchoring groups are present.

The term "covalent coupling", as used herein, is used interchangeably with the term "chemisorption".

In formula I, the letter "G" refers to a group which preferably is an acidic group in the sense that such group has a proton that can be dissociated from such group. Preferably, G is selected from COOH, $SO_3H$, $PO_3H_2$, $BO_2H_2$, SH, OH, $NH_2$. A is selected from the group comprising H, —CN, —$NO_2$, —COOR, —COSR, —COR, —CSR, —NCS, —$CF_3$, —$CONR_2$, —$OCF_3$, $C_6H_{5-m}F_m$, wherein m=1-5.

The term "a molecule that is able to absorb in the wavelength range of visible and/or IR light" as used herein, is meant to refer to a molecule that is able to absorb light in only one or several parts of the entire range indicated or over the total range. For example a molecule may only absorb in the range of from 500-700 nm, whereas another molecule may absorb in the range of from 750-1000 nm, whereas a third molecule may absorb over the range of from 300-1200 nm. All these scenarios are meant to be encompassed by such wording.

With reference to formula II which exemplifies the "conjugated system" in accordance with the present invention, the term "a combination of the moieties are represented by formula II" is used. This is meant to encompass any molecule wherein one or several of the structures given in formula II are covalently linked to each other to also produce a "conjugated system".

A "functionalized conjugated system", as used herein, is meant to refer to a conjugated system which has been endowed with a chemical functionality that allows such conjugated system to react with other molecules. Examples for such functionalized conjugated system are a metallated conjugated system having an aldehyde group into which functionalized conjugated system an anchoring group may be introduced.

The term "substituted phenyl/biphenyl" is meant to refer to any phenyl/biphenyl wherein a hydrogen has been replaced by a substituent, such as a halogen, $NO_2$, $NH_2$, OH or other suitable functional groups. Such substituents have for example been defined above $R_1$, which substituents may also be substitutents at a phenyl or biphenyl.

The present inventors have surprisingly found dyes which by using the long wavelength region of the solar spectrum >600 mm and when incorporated in DSSC show very good performance, namely >6%, preferably >8.5% high efficiency of DSSC, most notably compounds in accordance with formula I, such as compound 5 and 27.

The present inventors have moreover surprisingly found that if one endows organic dyes having molecular structure represented by formula I, these dyes are very well suited to be used in dye sensitized solar cells and sensor devices. The inventors have devised methods of synthesis for producing such dyes, and these dyes effectively adsorb on nanoporous semiconductor layers, such as $TiO_2$, they are active sensitizers in the visible, but also in the red/IR region of the solar spectrum which is a region where the standard Ruthenium based dyes, red- and black-dye, and other organic dyes, as 21 and 22, are not active. Moreover, the dyes according to the present invention show high quantum efficiency similar to that of the standard red-dye, but at in the longer wavelength region of the solar spectrum. If one therefore combines the dyes of the present invention with other dyes, such as other organic dyes or standard red dye or standard black dye, a broad range of the solar spectrum may be harvested. That makes the dyes of the present invention very promising to be used together with other dyes, such as organic dyes, standard red dye or standard black dye or further dyes according to the present invention with absorption maxima at different wavelengths. A dye sensitized solar cell comprising a dye according to the present invention, and, in addition thereto, one or more further dyes, is herein also referred to as a multiple-dyes sensitized solar cell (M-DSSC). Preferably, said one or more further dyes is also a dye according to the present invention.

Further, organic dyes have high absorption coefficients. This means it needs less amount of dye to absorb the same amount of light. Less amount of one dye on a surface enables the use of more dyes with different absorption properties, ideally being a mixture of dyes absorbing the whole range of the sun spectrum.

Moreover, in the dyes according to the present invention, the anchoring group consists of a group represented by the general formula

which is directly or optionally bridged by a conjugated system to the main core of the dye. Without wishing to be bound by any theory, the present inventors believe that this kind of anchoring group influences the electron density distribution in such way that after photo-excitation a fast electron injection occurs. The dye is directly attached to the semiconductor surface, such as the $TiO_2$ surface via the group G of the anchoring group. At the same time, the A-group of the anchoring group shown above, having an electron acceptor character is believed to have a positive effect on electron injection from the dye to the semiconductor. Again, without wishing to be restricted to any specific mechanisms, the present inventors believe, and molecular orbital calculations support their assumption that in the ground state, the electron density is localized on the chromophore or dye moiety, far away from the semiconductor surface. After photo-excitation, effective charge separation and electron fast migration from the dye-moiety next to the anchoring group via the conjugated system if present, otherwise directly, takes place. This process is promoted by the acceptor character of the A-group of the anchoring group. The electron distribution changes in such a way that the electron density becomes highest in the proximity of anchor group. The electron transfer from here to the conduction band of the semiconductor is therefore fast. This hypothesized intramolecular electron density relocation induced by photo-excitation is similar to the intra-molecular metal-ligand-charge-transfer in standard red dye.

The energy levels (HOMO/LUMO) of an organic dye can systematically be tuned by chemical structure modification in such a manner that they match with the other components of the DSSC: The energy level of the excited state of the dye (LUMO) with the conduction band of the semiconductor and the ground state energy level of the dye (HOMO) with the redox potential of the redox pair. If a conjugated system is present, its role is to allow the fast electron flow through the system and thus, the distribution relocation after photo-excitation. Further, an extended π-conjugation results in an additional red-shift of the absorption.

BRIEF DESCRIPTION OF THE DRAWINGS

A more complete appreciation of this disclosure and many of the attendant features thereof will be readily obtained as the same becomes better understood by reference to the following detailed description when considered in connection with the accompanying drawings, wherein.

Moreover reference is made to the following examples which are given to illustrate, not to limit the present invention.

EXAMPLES

Hereinafter, examples for the synthesis of the dyes and their intermediates, characterization and application of the dyes as sensitizers in DSSC will be described.

Example 1

Synthesis of sensitizer dye 5 with general formula V being described in claims 1-5 and having a cyano acrylic acid moiety attached to a squarylium dye as anchoring group via a thiophene as conjugated system by two different synthetic routes described above.

Figure 1:
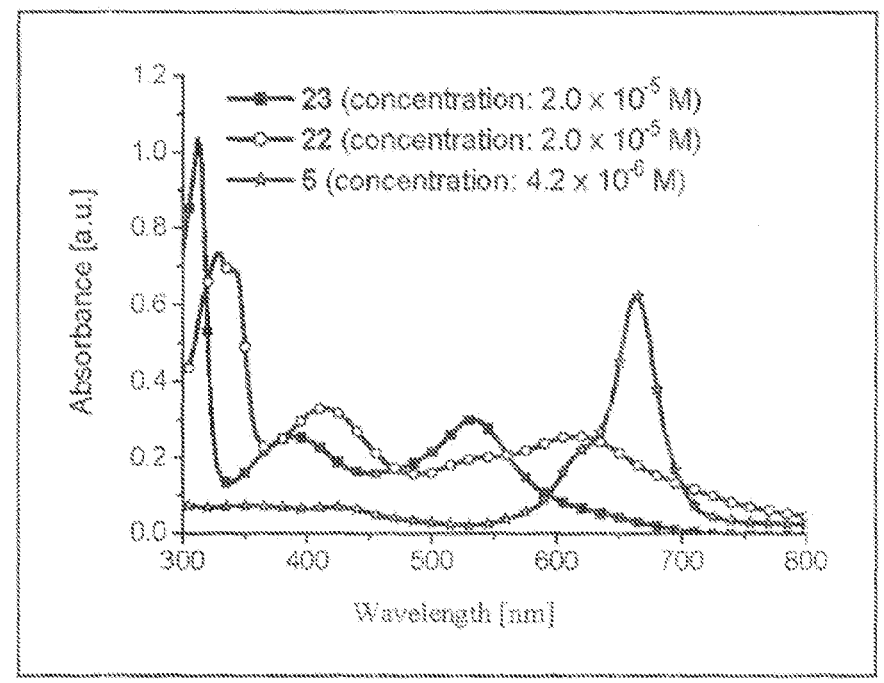
FIG. 1 shows an example of a synthesis scheme of one embodiment of a dye according to the present invention, wherein a halogenated chromophore is reacted with a metalated conjugated system comprising a carboxyaldehyde moiety in its structure, and thereafter the carboxyaldehyde moiety is transformed into an anchoring group.
Figure 2:
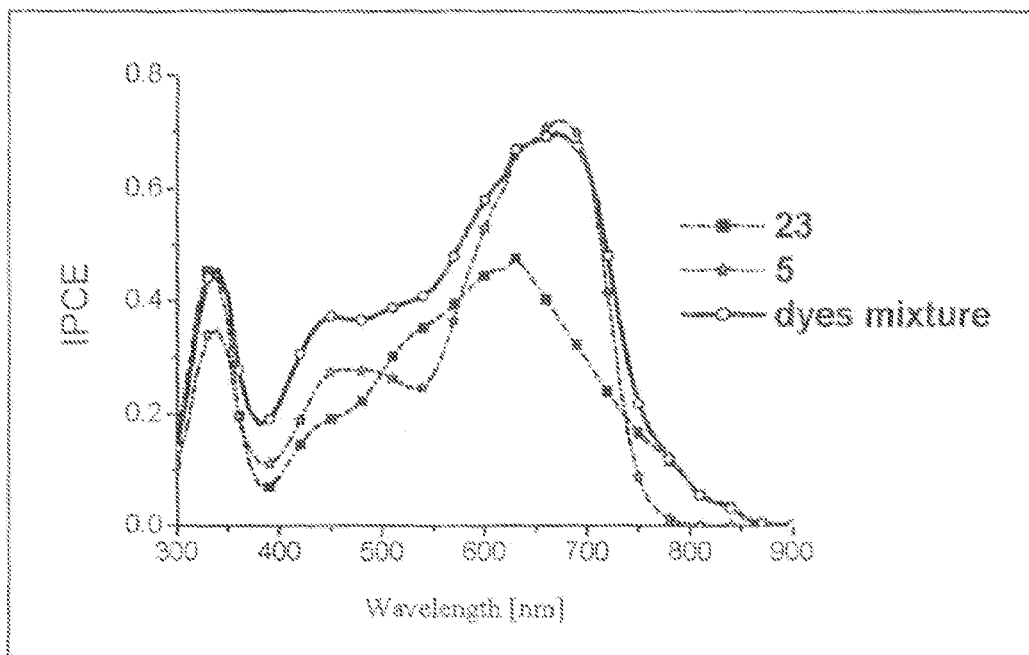
FIG. 2 shows an example of a synthesis scheme of one embodiment of a dye according to the present invention, wherein a metalated chromophore is reacted with a halogenated conjugated system comprising a carboxyaldehyde moiety in its structure, and thereafter the carboxyaldehyde moiety is transformed into an anchoring group.

1) This is an example of the general synthesis scheme depicted in FIG. 1.

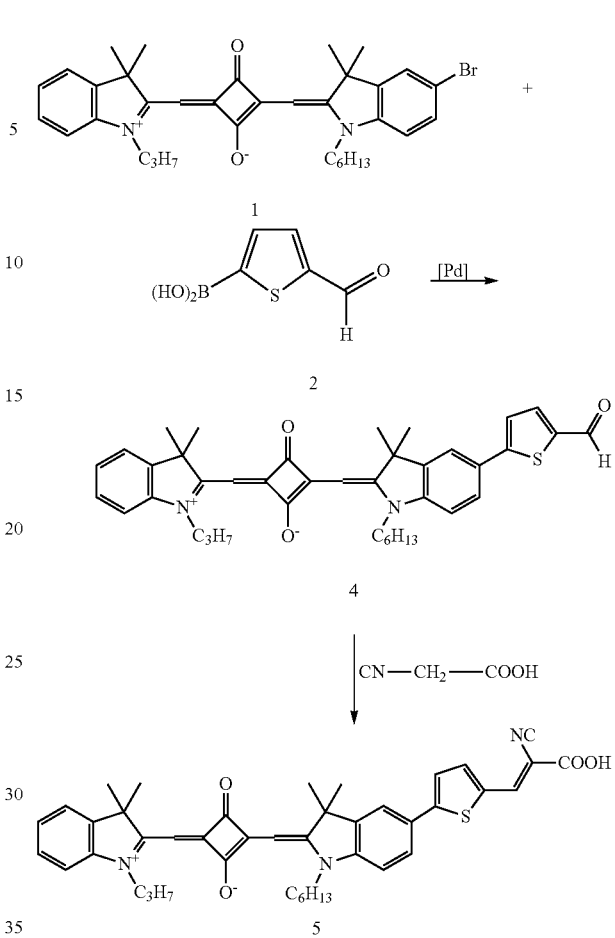

1 is halogenated chromophore
2 is metalated conjugated system comprising a carboxyaldehyde in its structure
step a) Reaction of 1 and 2 by palladium mediated coupling reaction resulting in formation of compound 4; step b) transformation of carboxyaldehyde moiety into anchoring group by reaction of 4 with cyano acetic acid to the targeted 5.

Step a) Under inert atmosphere, to a mixture of chromophore 1 in toluene/methanol mixture, 1 mol % catalysator Pd(PPh$_3$)$_4$, 1.2 equivalent of thiophene-carbaldehyde boronic acid were added. The reaction mixture was stirred at 120° C. for 12 h. After cooling to room temperature, the solvent was removed under reduced pressure. The mixture was extracted with dichloromethane and the solvent removed under reduced pressure. Purification of the crude product was performed by column chromatography on silica gel with (6/4) dichloromethane/acetone to give the pure thiophene-carbaldehyde derived 4.

Step b) A mixture of compound 4 and cyano acrylic acid in acetonitrile are heated in the presence of small amount of piperidine to 80° C. for 12 hours. After cooling, the solvent is removed under reduced pressure and the crude product is purified by column chromatography on silica gel with (5/5) acetone/ethylacetate to give the dye 5 as a green red shining powder.

Figure 3:
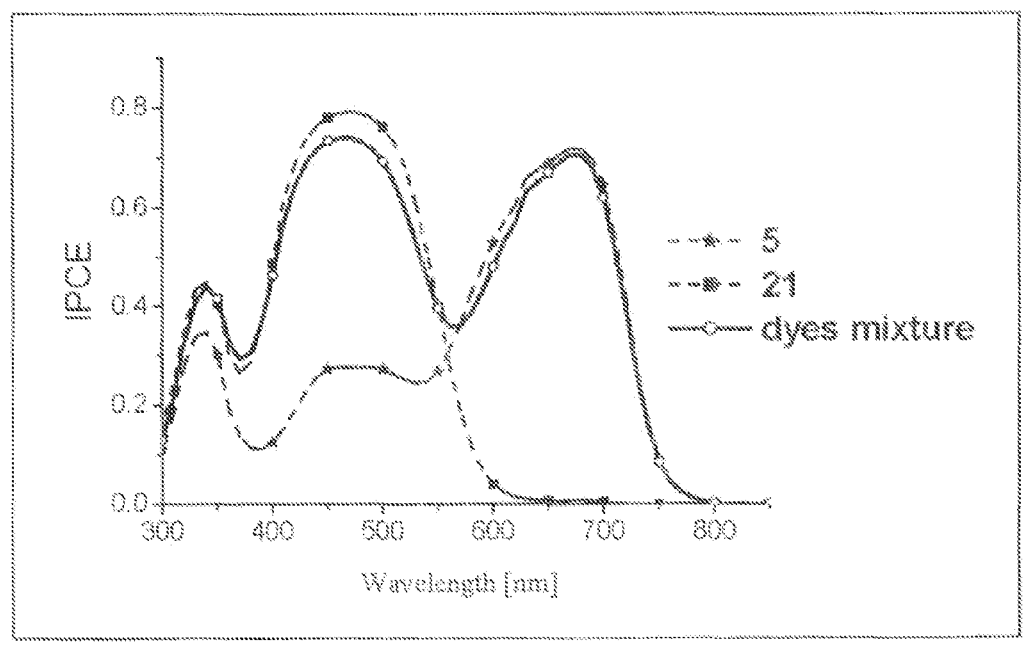
FIG. 3 shows an example of a synthesis scheme of one embodiment of a dye according to the present invention, wherein first a metalated conjugated system is reacted with a halogenated chromophore, and thereafter the carboxyaldehyde moiety is introduced, which thereafter is transformed into an anchoring group.
Figure 4:
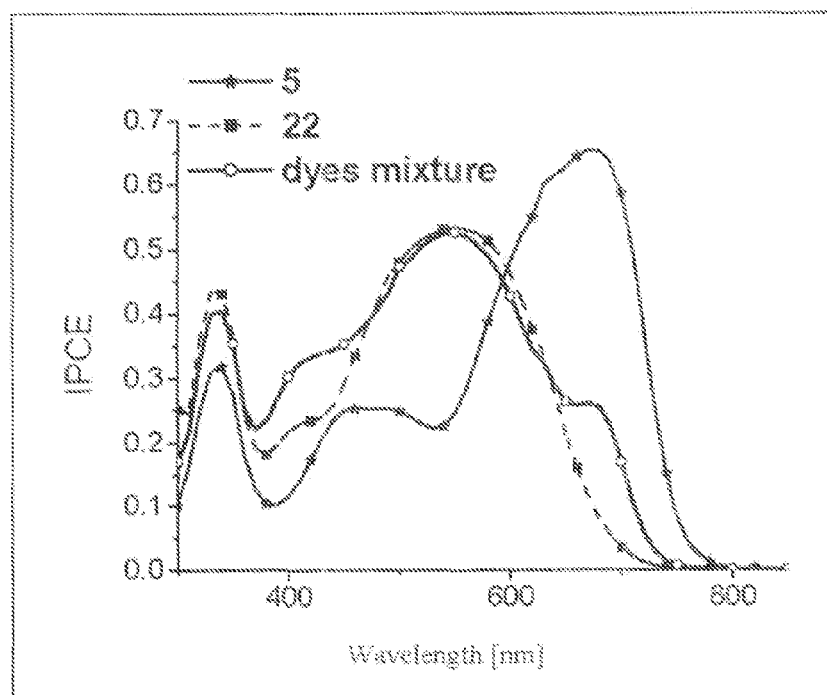
FIG. 4 shows an example of a synthesis scheme of one embodiment according to the present invention, wherein first a halogenated conjugated system is reacted with a metalated chromophore, and thereafter the carboxyaldehyde moiety is introduced, which thereafter is transformed into an anchoring group.

2) This is an example of the general synthesis scheme depicted in FIG. 3

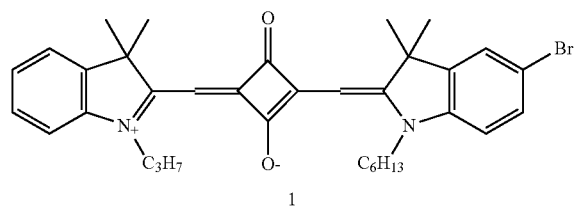

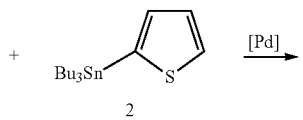

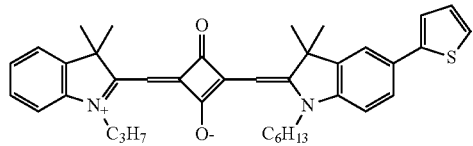

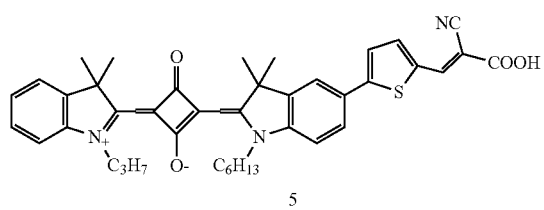

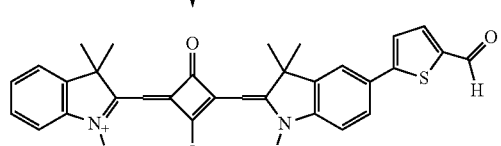

1 is halogenated chromophore
2 is metalated conjugated system
step a) Reaction of 1 and 2 by palladium mediated coupling reaction results in formation of compound 3; step b) The carboxylaldehyde moiety is introduced to compound 3 by Vilsmaier-Haak reaction; And step c) carboxyaldehyde moiety is transformed to anchoring group by reaction of 4 with cyano-acetic acid resulting in targeted 5.

Step a) Under inert atmosphere, to a mixture of chromophore 1, 1 mol % catalysator Pd(PPh$_3$)$_4$, 1 equivalent of CsF in toluene, 1.2 equivalent of tributylstannyl-thiophene were added. The reaction mixture was stirred at 120° C. for 12 h. After cooling to room temperature, dichloromethane was added. The white salt (Bu$_3$SnF) formed during the reaction was filtered off and the solvent removed under reduced pressure. Purification of the crude product was performed by column chromatography on silica gel with (4/6) dichloromethane/ethylacetate to give the pure thiophene derived squarylium dye 3.

Step b) Under inert atmosphere, compound 3 is dissolved in anhydrous DMF. 1 equivalent of POCl$_3$ is slowly added and the mixture stirred at 70° C. for 4 hours. The mixture was allowed to cool down to room temperature, ice and water and aqueous NaOH for neutralisation were added. The mixture is extracted with dichloromethane and the solvent removed under reduced pressure. The crude product was purified by column chromatography on silica gel with (2/8) acetone/ethylacetate to give the pure compound 4.

Step c) A mixture of compound 4 and acrylic acid in acetonitrile were heated in the presence of small amount of piperidine to 80° C. for 12 hours. After cooling, the solvent was removed under reduced pressure and the crude product was purified by column chromatography on silica gel with (5/5) acetone/ethylacetate to give the dye 5 as a green red shining powder.

Example 2

Figure 5:
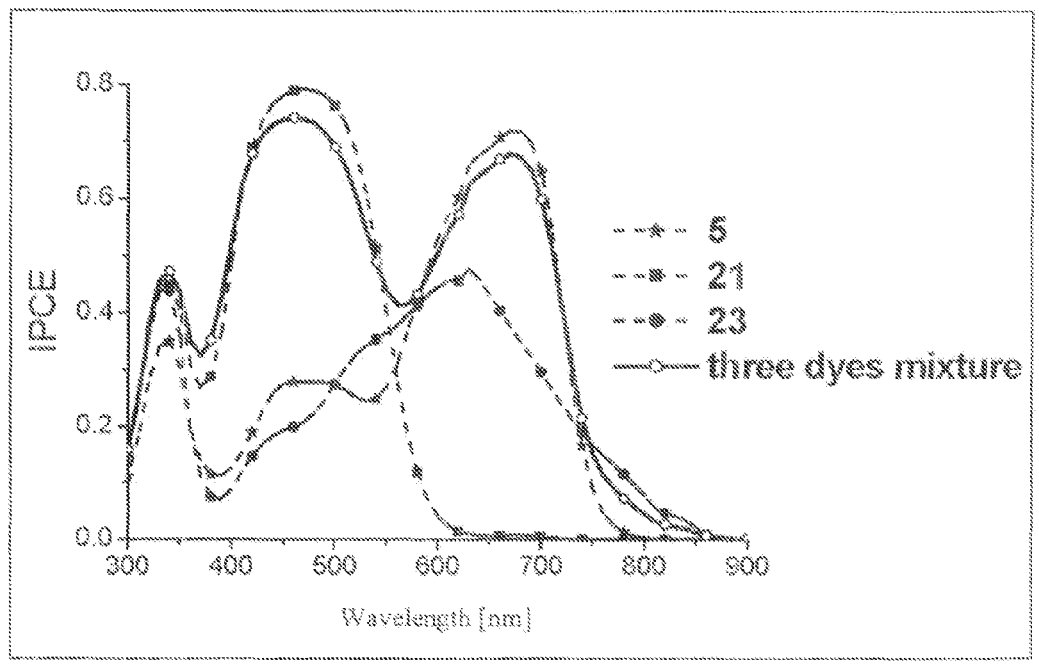
FIG. 5 shows an example of a synthesis scheme of one embodiment according to the present invention, wherein an intermediate, the halogenated squarylium dye of general formula 1 is produced.
Figure 6:
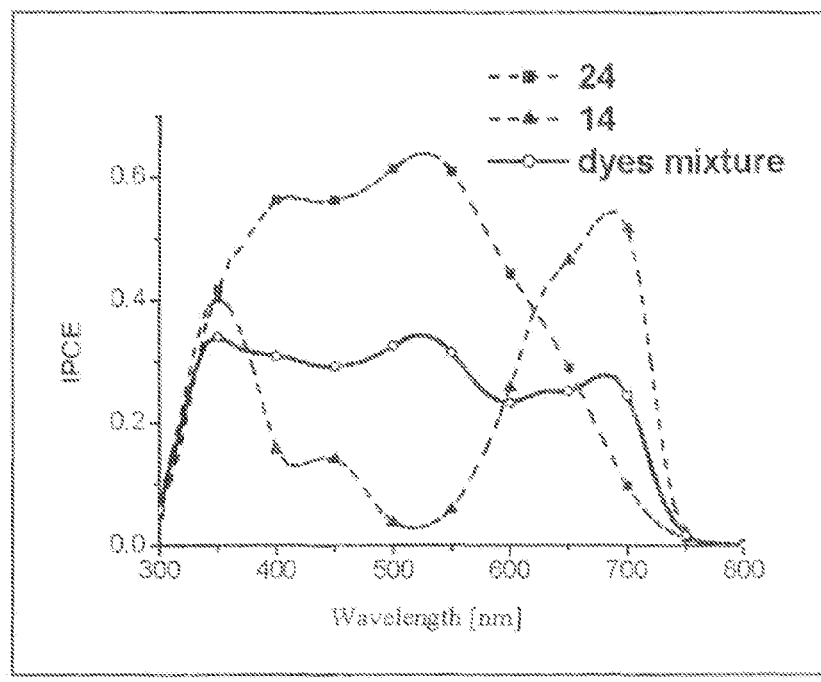
FIG. 6 shows a synthesis scheme of a dye in accordance with the present invention having a cyano acrylic acid moiety as anchoring group directly attached to the chromophore, which is squarylium dye, being represented by general formula I with $n_2=0$.
Figure 7:
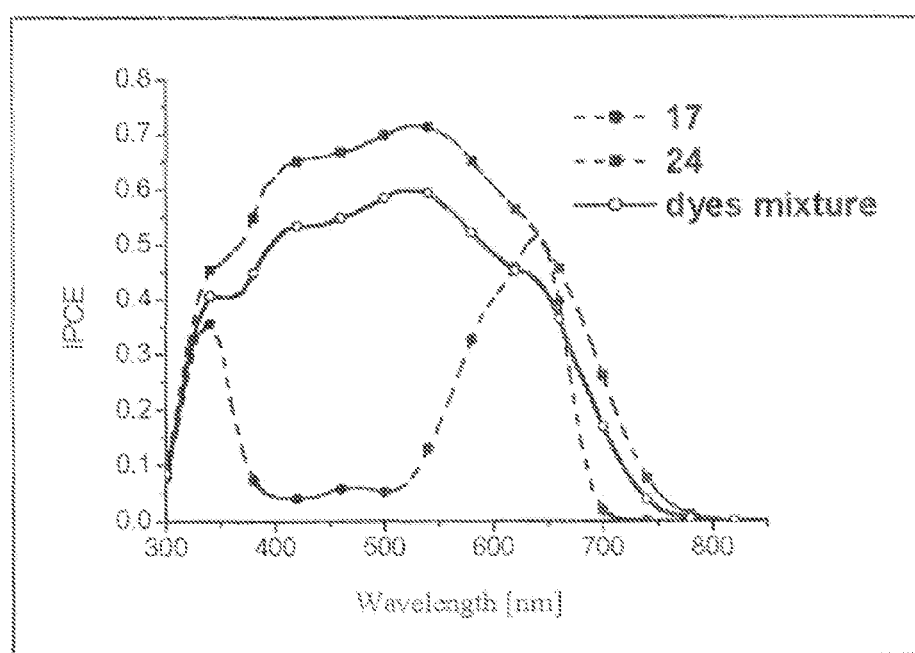
FIG. 7 shows an example of a synthesis scheme of one embodiment according to the present invention, wherein a sensitizer dye 27 is produced.

Synthesis of a halogenated squarylium dye 1 by the route described above and depicted in FIG. 5

Step a) formation of alkyl ester of a squaric acid derivative 1c

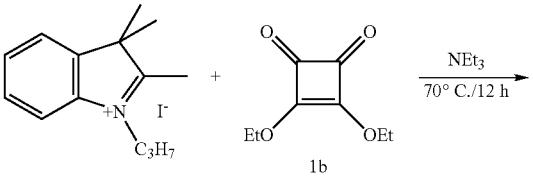

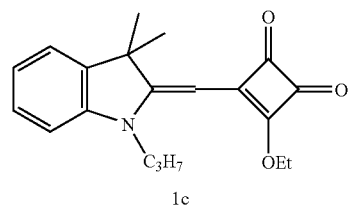

A mixture of 1a, diethylester derivative of squaric acid 1b, triethylamine in ethanol was heated to 70° C. for 12 h. The solvent was removed and the crude product was purified by column chromatography on silica gel with dichloromethane as eluent. The pure semisquaric acid derivative 1c was isolated as orange solid.

Step b) first deprotection of alkyl ester group to result in 1d followed by reaction with 1e to give the brominated squarylium dye 1.

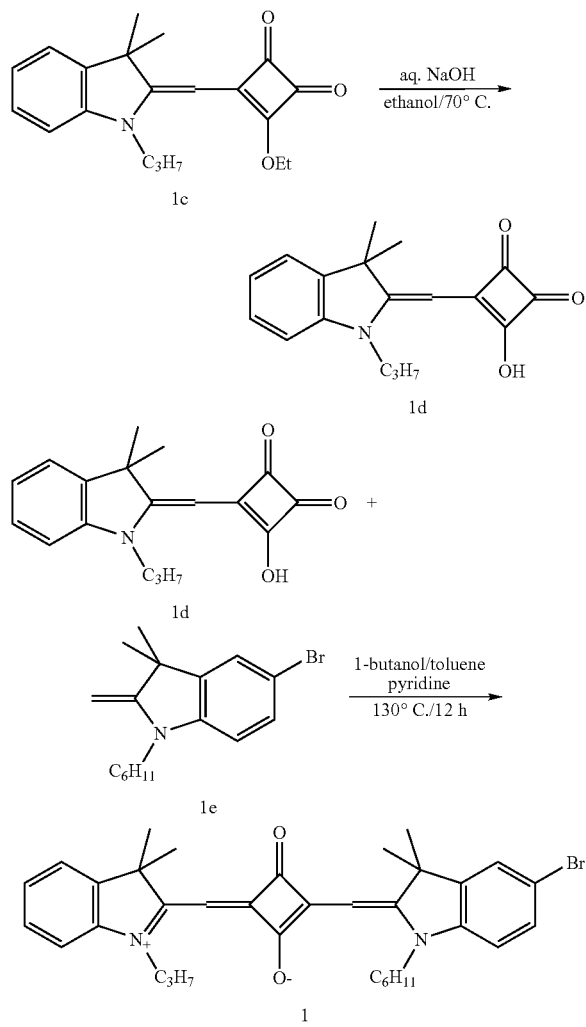

Semisquaric acid derivative 1c was poured in ethanol and a few drops of 0.5 M aq. NaOH were added. The mixture was stirred for 3 h at 70° C. After cooling 1M HCl were added. By evaporation of solvent product 1d is isolated as yellow solid. 1d was than further reacted with 1 equivalent of 1e in a 1:1 mixture of 1-butanol/toluene in the presence of pyridine. Under reflux (130° C.), the reaction generated water that was removed by azeotropic distillation or by using molecular sieves. After 1 h reaction time, formation of squarylium dye was indicated by the appearance of a blue-green colour. After 12 h at 130° C., the reaction mixture was allowed to cool to room temperature and the solvent removed under reduced pressure. The crude product was purified by column chromatography on silica gel with (8/2) dichloromethane/ethylacetate as eluent. The pure product 1 was isolated as green solid.

Example 3

Analytical data of dyes and intermediates described above
Analytical data for compound 1
C35H39BrN2O2 (599.60)
1H NMR (400 MHz, CDCl3): δ=7.35-7.20 (m, 4H, arH), 7.09 (t, 1H, arH), 6.95 (d, 1H, arH), 6.74 (d, 1H, arH), 5.92 (s, 1H, =CH—), 5.84 (s, 1H, =CH—), 4.05, 3.83 (brs, 4H, N—CH2), 1.96-1.70 (m, 16H, CH2-Propyl, CH2-Hex, 6H, CH3), 1.21 (t, 6H, CH3-Et), 1.26-1.23 (brs, 12H, CH2), 0.95 (t, 3H, CH3-Hex or CH3-Propyl), 0.80 (t, 3H, CH3-Hex or CH3-Propyl)
ESI MS m/z=601.3 [M+].
UV/VIS (acetonitrile): λmax=636 nm.
Analytical data for compound 3
C39H44N2O2S (604.84)
1H NMR (400 MHz, MeOD): δ=7.71 (s, 1H, arH), 7.62 (d, 1H, arH), 7.43 (d, 1H, arH), 7.39-7.34 (m, 3H, arH), 7.25-7.18 (m, 3H, arH), 7.08 (t, 1H, arH), 5.83 (d, 1H, H-7), 5.98 (s, 1H, =CH—), 5.94 (s, 1H, =CH—), 4.09 (q, 4H, N—CH2), 1.81-1.23 (m, 8H, CH2-Hex), 1.74 (s, 6H, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)
ESI MS m/z=605.3 [M+].
UV/VIS (acetonitrile): λmax=645 nm.
Analytical data for 4
C40H44N2O3S (632.85)
1H NMR (400 MHz, CDCl3): δ=9.89 (s, 1H, H-aldehyde), 7.76 (d, 1H, arH), 7.64 (m, 2H, arH), 7.42-7.32 (m, 4H, arH), 7.19 (t, 1H, arH), 7.05 (d, 1H, arH), 6.97 (s, 1H, arH), 5.98 (s, 1H, =CH—), 5.34 (s, 1H, =CH—), 4.02 (brs, 2H, N—CH2), 3.95 (brs, 2H, N—CH2), 1.81-1.23 (m, 8H, CH2-Hex), 1.74 (s, 6H, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)
ESI MS m/z=633.4 [M+].
UV/VIS (acetonitrile): λmax=654 nm.
Analytical data for 5
C43H45N3O4S (699.31)
1H NMR (400 MHz, CDCl3): δ=8.18 (s, 1H, =CH—), 7.79 (d, 1H, arH), 7.31 (d, 1H, arH), 7.42-7.32 (m, 4H, arH), 7.19 (dd, 1H, arH), 7.01 (d, 1H, arH), 6.95 (s, 1H, arH), 5.98 (s, 1H, =CH—), 5.34 (s, 1H, =CH—), 4.02 (brs, 2H, N—CH2), 3.95 (brs, 2H, N—CH2), 1.81-1.23 (m, 8H, CH2-Hex), 1.74 (s, 6H, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)
ESI MS m/z=700.3 [M+].
UV/VIS (acetonitrile): λmax=665 nm.

Example 4

Molecular modelling—theoretical calculations of dye 5 having a cyano acrylic acid moiety attached as anchoring group to squarylium dye as chromophore via a thiophene as conjugated system an Molecular modeling was performed by using Materials Studio 4.0 DMol3 software based on density functional theory. This dye exhibits physical properties described below. The high performance of the dye as sensitizer in DSSC is attributed to the structure of the dye according to this invention and represented by general formula I.

Figure 8:
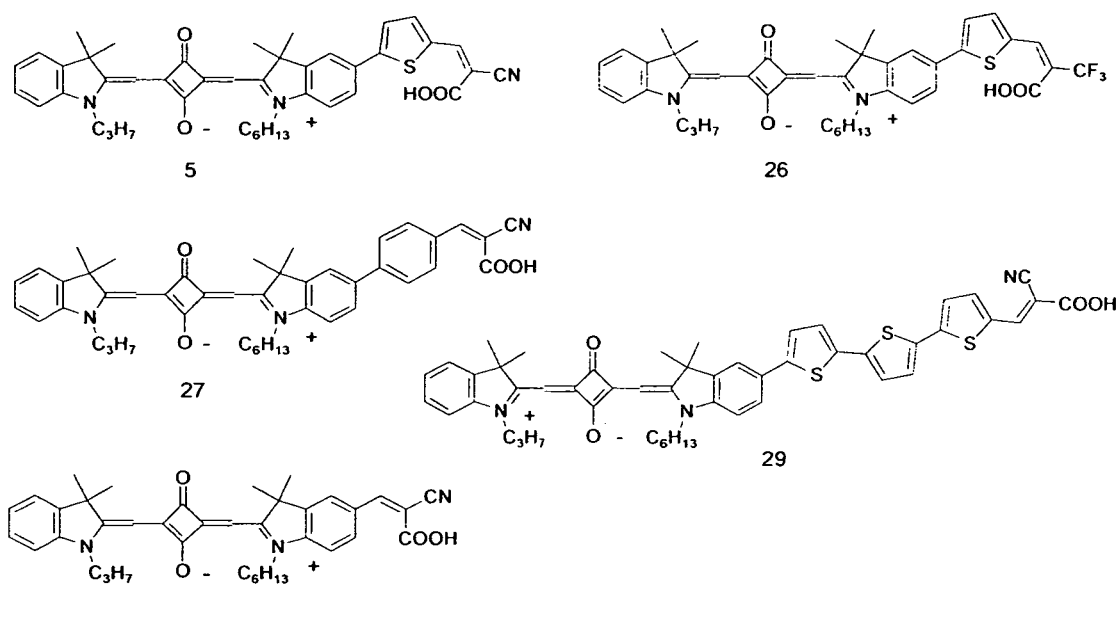
FIG. 8 shows the structure of different sensitizer dyes prepared according to the present invention.
Figure 12:
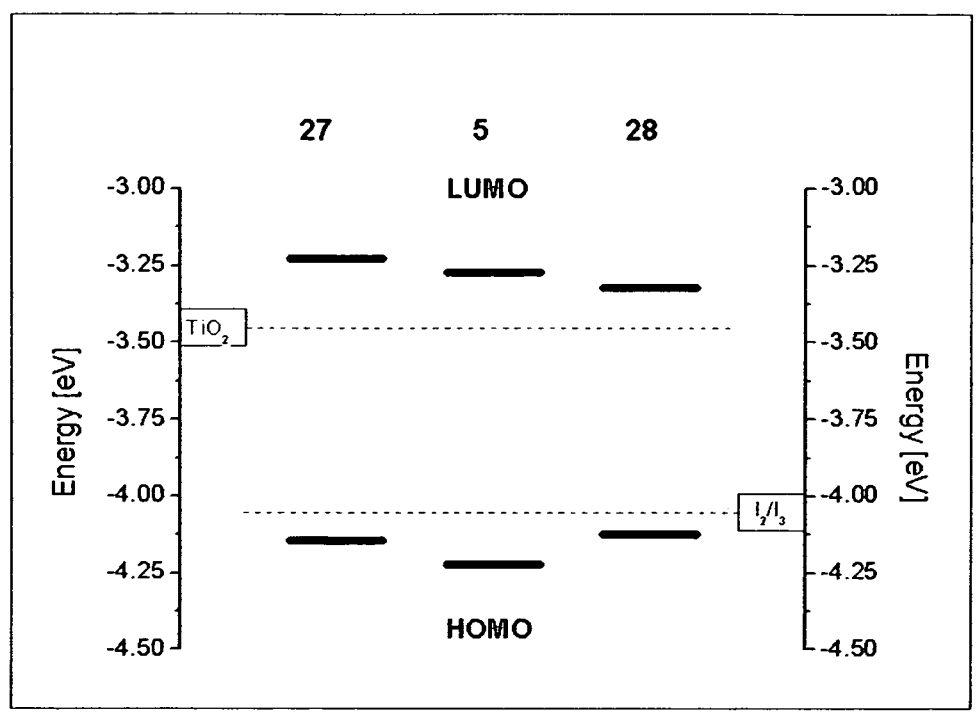
FIG. 12 shows the energy levels of different sensitizer dyes according to present invention obtained by theoretical calculations; calculations (molecules in vacuum) are based on density functional theory using materials studio software from Accelrys.
Figure 13:
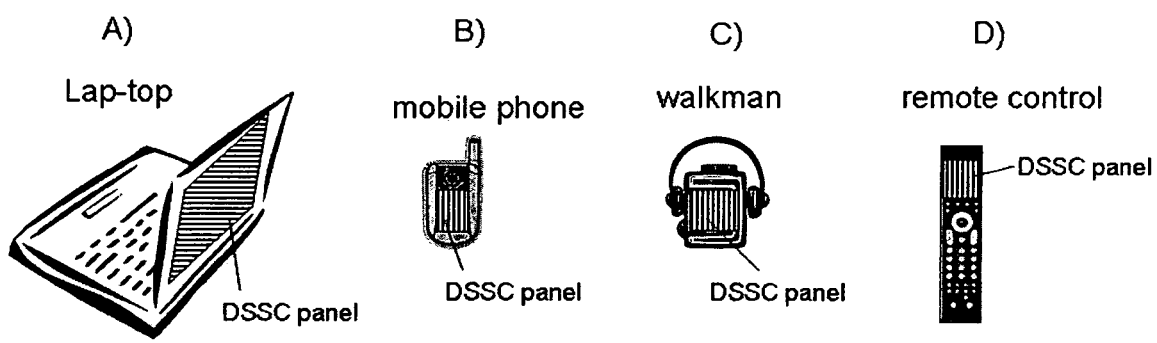
FIG. 13 shows various embodiments of electronic devices in accordance with the present invention which include energy supply devices, such as DSSC panels, in accordance with the present invention.

FIG. 12 shows energy levels of different dyes according to present invention including for comparison the energy levels of other components of the DSSC, redox pair and semiconductor conduction band. The structure of the dyes is given in FIG. 8. The sensitizer dyes absorb light in the range >630 nm and the efficiency of the DSSC prepared with these sensitizers shows efficiencies >6%. The energy levels of the dyes are well matched to semiconductor and redox-pair. These properties are strongly related with the nature of the chromophore and conjugated system.

Figure 10:
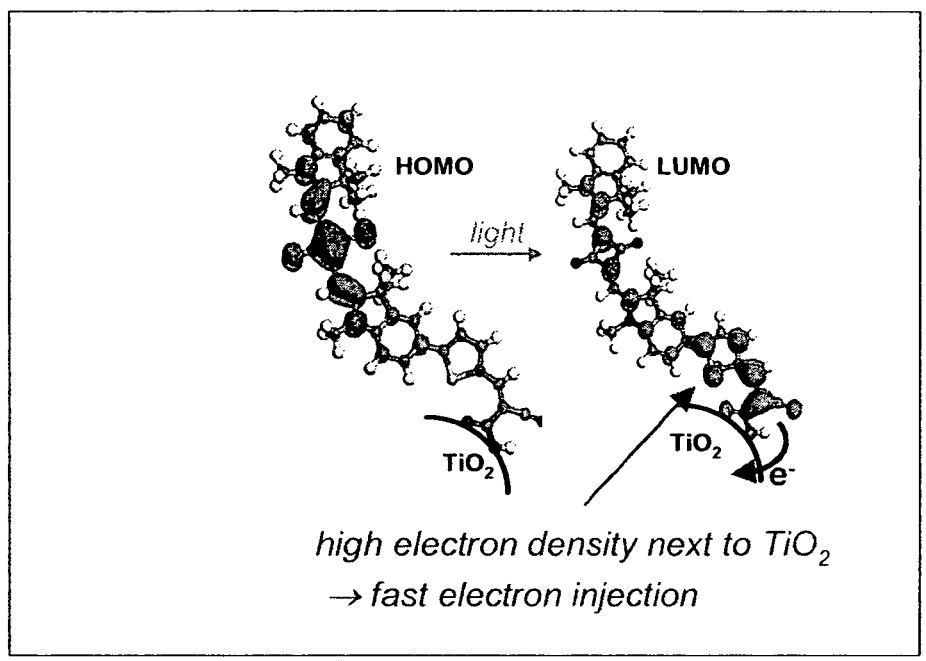
FIG. 10 shows the electron distribution of dye 5 in accordance with the present invention in the ground and excited state; molecular modeling was performed, calculations are based on density functional theory using materials studio software from Accelrys.
Figure 11:
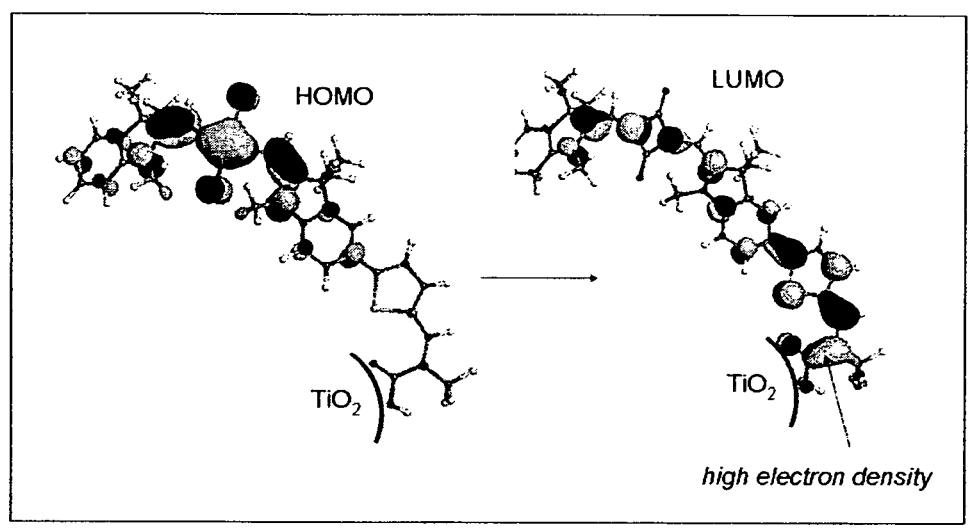
FIG. 11 shows the electron distribution of dye 26 in accordance with the present invention in the ground and excited state; molecular modeling was performed, calculations are based on density functional theory using materials studio software from Accelrys.

FIG. 10 shows the electron distribution in ground and excited state of the sensitizer dye 5 and FIG. 11 of the sensitizer 26. For both, the nature of the anchor group allows an intramolecular relocation of the electron density by photoexcitation. Respectively, on the left side of the figure the molecule in ground state shows the electron density is highest on the chromophor, far away from the semiconductor surface. On the right side the LUMO of the molecule is depicted. This is correlated with the electron distribution of the molecule after photoexcitation. After photoexcitation, the electron density is very high in the vicinity of the anchoring group that allows the direct coupling with the nanoporous semiconductor. The present inventors believe that this situation enables a very fast electron injection.

Hence, overall, in the present application, dyes are disclosed which are stable and are characterized by a strong absorption and emission in the visible and IR region of the solar spectrum, and they are useful as sensitizers in DSSCs for these regions. In combination with the standard red-dye, or standard black-dye or other organic dyes, they are able to collect the solar light over a broad range of the solar spectrum. The present inventors describe a molecular design of these dyes for improved performance in dye-sensitized solar cells. The anchoring group is believed to be responsible for the efficient adsorption of the dye-sensitizer onto the nanoporous semiconductor surface and consist of an acrylic acid moiety which is optionally bridged by a conjugated system to the main core of the dye. This kind of anchoring group is believed to enable a photo-excitation induced intramolecular electron density relocation in organic dyes resulting in better performance of the sensitizer in a photovoltaic device.

Example 5

Figure 14:
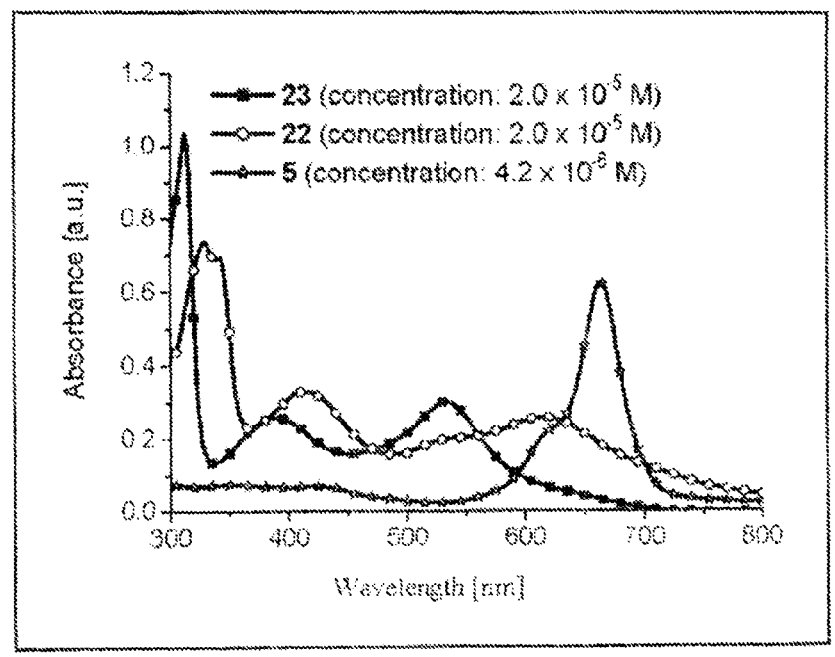
FIG. 14 shows a UV-Vis of an ethanol solution of sensitizer dye 5 and for comparison standard black dye 23 and standard red dye 24.

UV-Vis of an ethanol solution of sensitizer dye 5 and for comparison standard black dye 23 and standard red dye 24 (FIG. 14).

The absorption of compound 5 is strongly red shifted with maximum at 664 nm. Compared to the Ruthenium based dyes 23 and 24 which are the conventional sensitizers used in DSSC, dye 5 has a strong absorption with extinction coefficient being almost 15 times higher.

Example 6

General protocol for preparing solar cells by using
a) a 10-20 μm-thick mono-printed porous layer of $TiO_2$ semiconductor particles of 0.24 $cm^2$ active area
b) a 20-30 μm-thick multi-printed porous layer of $TiO_2$ semiconductor particles of 0.1882 $cm^2$ active area The DSSCs are assembled as follows: A 30-nm-thick bulk $TiO_2$ blocking layer is formed on FTO (approx. 100 nm on glass or flexible substrate). A 10-30 μm-thick porous layer of semi-conductor particles is screen printed on the blocking layer and sintered at 450° C. for half an hour. Dye molecules are adsorbed to the nanoporos particles via self-assembling out of a dye-solution. The dye-solution consists of a single dye or single dye and an additive, such as deoxycholic acid or a mixture of dye in different ratio or a mixture of dye in different ratio and an additive. The porous layer is filled with a) liquid electrolyte b) polymer gel electrolyte containing $I^-/I_3^-$ as redox couple (15 mM) by drop casting. A reflective platinum back electrode is attached with a distance of 6 μm from the porous layer.

Example 7

Figure 9:
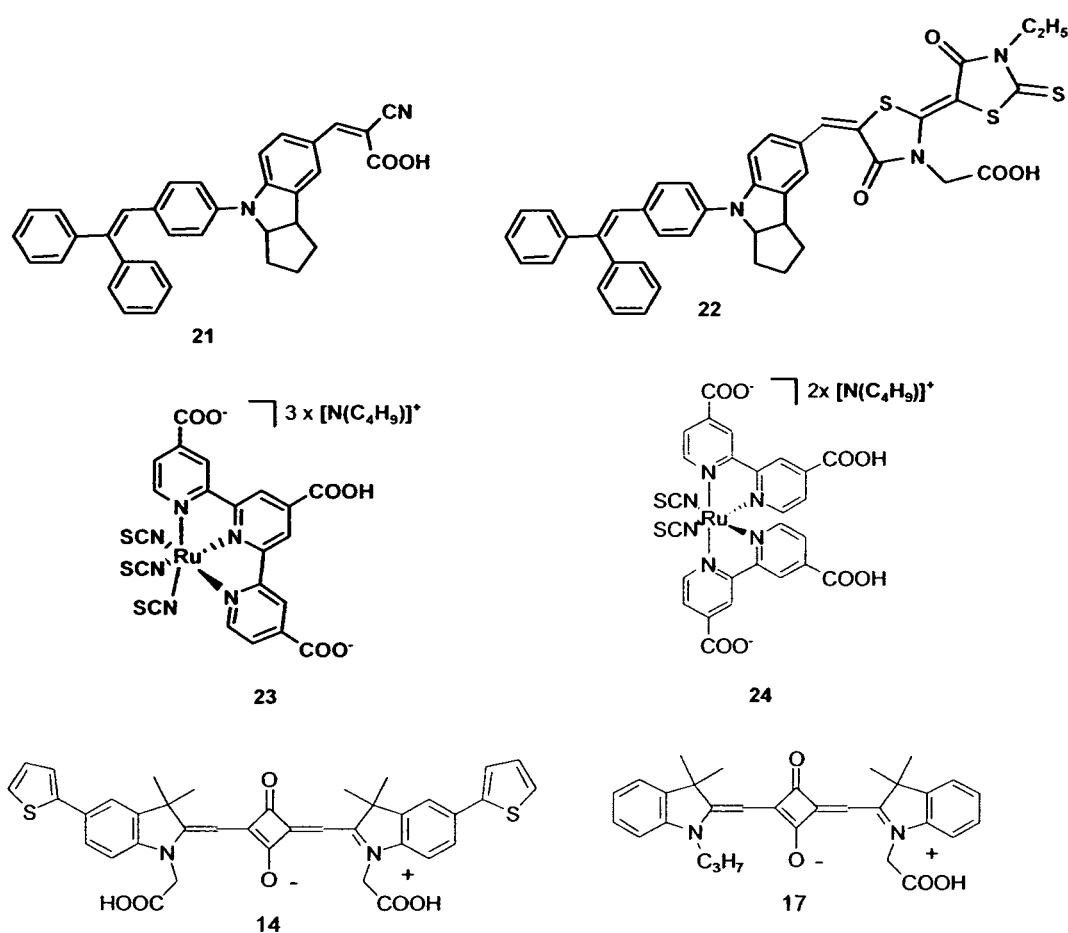
FIG. 9 shows the structure of different dyes which were investigated for comparison as sensitizer in DSSC and used in mixture with sensitizer dyes according to the present invention in M-DSSC: 21, 22=organic dyes from the class of the merocyanine dyes; 23=standard black dye and 24=standard red dye which are the conventional sensitizers used in DSSC; 14 and 17=sensitizer dye from the similar class of squarylium dyes, but having different molecular structure as given by general formula I (without specific anchoring group)

Measuring the efficiency of DSSCs containing at least one of the sensitizer dye produced by the method of the present invention. The respective structure of the dyes is given in FIGS. 8 and 9.

The quality of the cells is evaluated by means of current density (J) and voltage (V) characteristics under illumination with light from
a) a sulphur lamp (IKL Celsius, Light Drive 1000) with an intensity of 100 mW $cm^{-2}$. If not otherwise stated, the results are averages over three cells.
b) a sun simulator (AM1.5G YSS-150) with an intensity of 100 mW $cm^{-2}$.

If not otherwise stated, the results are averages over three cells.

The efficiency of a photovoltaic device is calculated as follows:

$$\eta = P_{out}/P_{in} = FF \times (J_{SC} \times V_{OC})/(L \times A)$$

with $FF = V_{max} \times I_{max}/V_{oc} \times I_{sc}$
FF=fill factor
$V_{OC}$=open circuit voltage
$J_{SC}$=short current density
L=intensity of illumination=100 mW/$cm^2$
A=active area=0.24 $cm^2$
$V_{max}$=voltage at maximum power point
$J_{max}$=current at maximum power point An important parameter for judging the performance of a dye as sensitizer in DSSC is the IPCE curve. The IPCE curve reflects the photo-activity of the sensitizer dyes at different wavelengths (IPCE=incident photon to current efficiency).

For having a better comparison by measuring the efficiency of DSSCs containing the sensitizer dyes of the present invention in most cases, as reference, a cell containing the commercial standard red dye (so called bisTBA-Ru535 or N719) or black dye (so called Ru620-1H3TBA or N749) is prepared under same conditions.

Example 8

Comparing efficiency of the DSSC by using squarylium dye 5, 14 and 17, respectively DSSCs were prepared by method described in Example 6a and measured by method described in 7a.

The three dyes belong to the same class of dyes, namely squarylium dyes. Dye 5 and 14 have thiophene moieties attached to the squarylium dye core, which shifts the absorption in the more red region of solar spectrum. Dye 5 and 17, both have only one anchor group, but sensitizer dye 5 has the molecular structure and specially the anchoring group according to any of claims 1-5.

| Sensitizer | Absorption max. in ethanol | $J_{SC}$ [mA/$cm^2$] | $V_{OC}$ [mV] | FF [%] | η [%] |
|---|---|---|---|---|---|
| 5[1] | 660 nm | 13.3 | 620 | 74 | 6.13 |
| 14[1] | 665 nm | 8.9 | 675 | 67 | 4.04 |
| 17[2] | 630 nm | 3.0 | 710 | 78 | 1.67 |

[1]$TiO_2$ dye-coating from 0.125 mM dye solution + with additive deoxycholic acid 20 mM.
[2]$TiO_2$ dye-coating from 0.3 mM dye solution + with additive deoxycholic acid 20 mM.

The efficiency of the DSSC prepared with sensitizer dye 5 shows much higher efficiency (>6%) as the ones prepared with the other two dyes. This is the highest efficiency of a DSSC ever reported for a device prepared by using an organic dye absorbing light in long wavelength range of solar spectrum >600 nm.

The superiority of the sensitizer dyes with a structure according to any of claims 1-5, such as 5 or 27, over other organic dyes is reflected by the fact that this sensitizer dye can be used in mixture with other sensitizer dye resulting in higher efficiency of the solar cell than using a single sensitizer dye. The inventors name this type of solar cell device in which more than one dye is used as sensitizer for harvesting the light Multiple-dyes sensitized solar cell (M-DSSC).

Example 9

Efficiency of M-DSSC containing sensitizer dye 5 and the standard black dye 23 prepared by the method described in Example 6a and measured according to Example 7a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 23[2] | 12.8 | 755 | 74 | 7.12 |
| Mixture 5 and 23[3] | 16.1 | 675 | 72 | 7.82 |

[1] TiO$_2$ dye-coating from 0.125 mM dye solution + with additive deoxycholic acid 12.5 mM.
[2] TiO$_2$ dye-coating from 0.375 mM dye solution + with additive deoxycholic acid 20 mM.
[3] TiO$_2$ dye-coating from a dyes mixture solution (dye 5 0.125 mM, + dye 23 0.375 mM + with additive deoxycholic acid 20 mM).

By using a solution in which the dyes are mixed in ration 1:3 the efficiency DSSC is increased. This is mostly due to the increased short current density.

Figure 15:
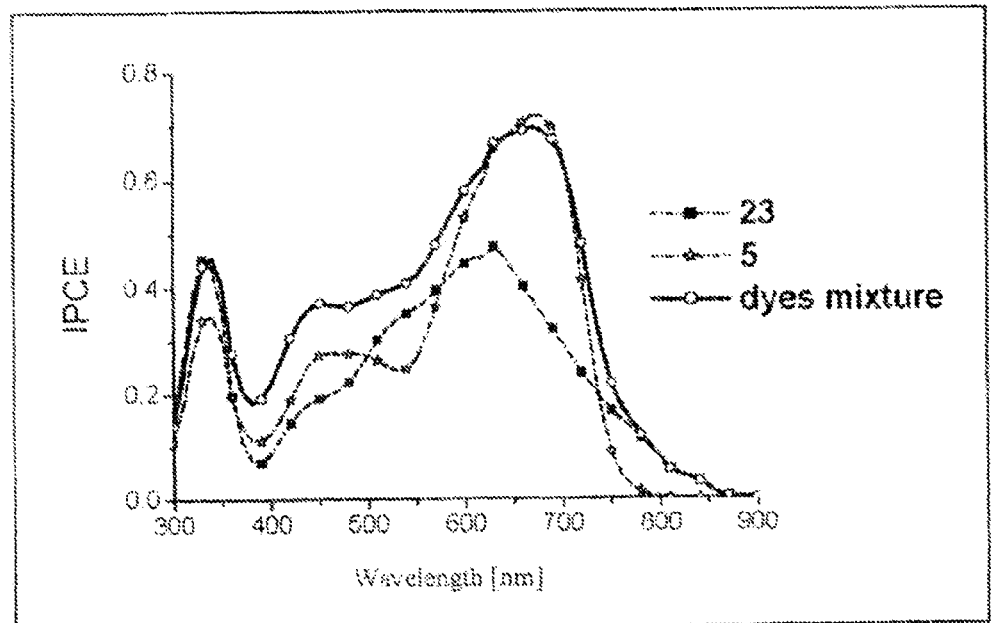
FIG. 15 shows a comparison of a the IPCE curves of Mixture 5, standard black dye 23, and a mixture of Mixture 5 and standard black dye 23.

Usually, in the field of DSSC standard black dye 23 is preferably used instead standard red dye 24 when high photoactivity in the long wavelength region of solar spectrum is needed. By comparing the IPCE curves of 5 and standard black dye 23, it can be seen that dye 5 having structure according claim 1 shows much higher photo-activity in the range of 550-750 nm than black dye 23 (FIG. 15).

Further, in the IPCE curves it can be seen that the incident-photon-conversion-efficiencies of the two dyes 5 and 23 behave in an additive way; therefore the dye mixture has better performance than the single dyes.

This is the first time that such a phenomenon is realized.

Example 10

Efficiency of M-DSSC containing sensitizer dye 5 and the organic dye 21 prepared by the method described in Example 6a and measured according to Example 7a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 21[2] | 14.8 | 685 | 72 | 7.32 |
| Mixture 5 and 21[3] | 21.0 | 655 | 70 | 9.61 |

[1] TiO$_2$ dye-coating from 0.125 mM dye solution + with additive deoxycholic acid 12.5 mM.
[2] TiO$_2$ dye-coating from 0.125 mM dye solution + with additive deoxycholic acid 12.5 mM.
[3] TiO$_2$ dye-coating from a dyes mixture solution (dye 5 0.125 mM, + dye 21 0.125 mM + with additive deoxycholic acid 20 mM).

Both dyes show high efficiencies. By using a solution in which the dyes are mixed in 1:1 ratio the efficiency of the DSSC devise increases. This is mostly due to the increased short current density.

Figure 16:
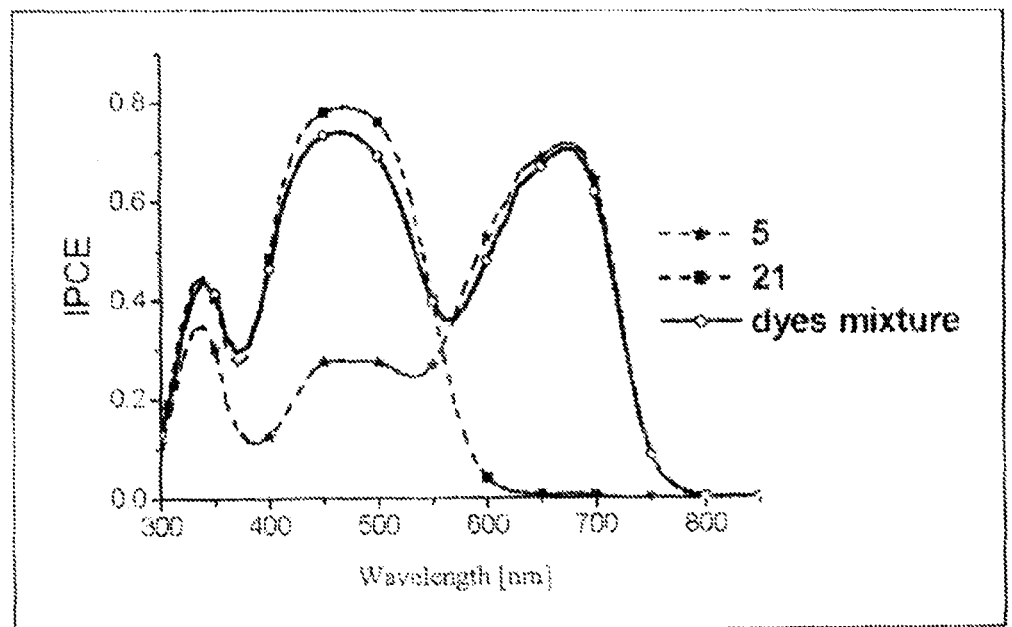
FIG. 16 shows a comparison of the IPCE curves of Mixture 5, dye 21, and a mixture of Mixture 5 and dye 21.

By comparing the IPCE curves of 5 and dye 21, it can be seen that dye 5 is photo-active in the range of 550-750 nm where standard dyes 23 and 24 and also organic dye 21 doesn't have so high or any photo-activity in this region (FIG. 16).

The IPCE curve of the dye mixture is a mirror of the added IPCE curve of the single dyes.

This is the reason why the dye mixture performs better than the single dyes.

This is the first time reported that such a mixture of pure organic dyes lead to higher efficiency in DSSC.

Example 11

Efficiency of M-DSSC containing sensitizer dye 5 and the organic dye 22 prepared by the method described in Example 6a and measured according to Example 7a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 22[2] | 11.1 | 665 | 69 | 5.07 |
| Mixture 5 and 22[3] | 18.4 | 630 | 71 | 8.18 |

[1] TiO$_2$ dye-coating from 0.125 mM dye solution + with additive deoxycholic acid 12.5 mM.
[2] TiO$_2$ dye-coating from 0.125 mM dye solution + with additive deoxycholic acid 12.5 mM.
[3] TiO$_2$ dye-coating from a dyes mixture solution (dye 5 0.125 mM, + dye 22 0.125 mM + with additive deoxycholic acid 20 mM).

Both dyes show high efficiencies. By using a solution in which the dyes are mixed in 1:1 ratio the efficiency of the DSSC devise increases. This is due to the additive behavior of the individual short current density.

Figure 17:
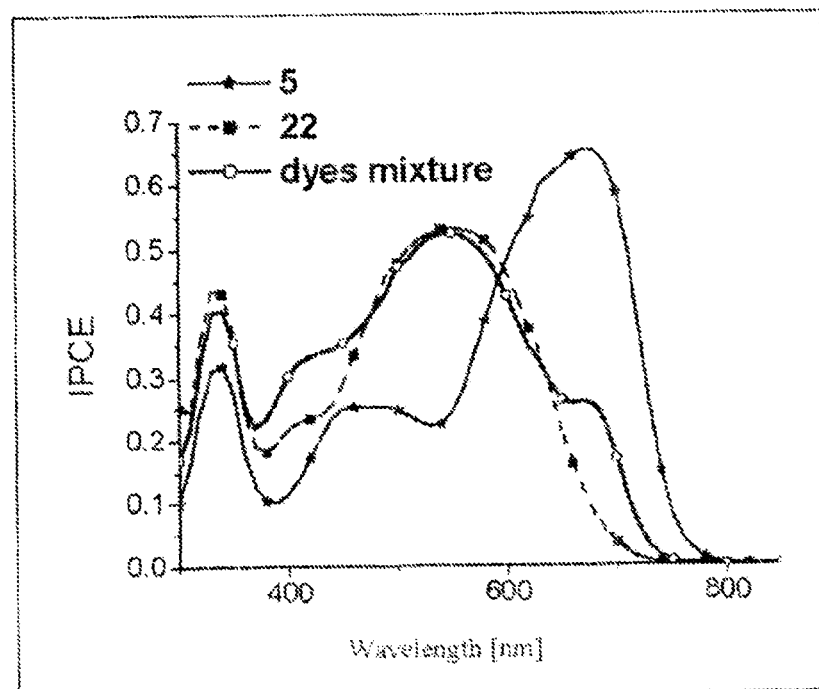
FIG. 17 shows a comparison of the IPCE curves of Mixture 5, dye 22, and a mixture of Mixture 5 and dye 22.

By comparing the IPCE curves of 5 and dye 22, it can be seen that dye 5 is photo-active in the range of 550-750 nm where standard dyes 23 and 24 do not have as high photoactivity and organic dye 22 does not have any photo-activity (FIG. 17).

Example 12

Efficiency of M-DSSC prepared by method described in Example 6a and measured according to Example 7a by using a mixture of three sensitizers: sensitizer dye 5, standard black dye 23 and organic dye 21. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 23[2] | 12.8 | 755 | 74 | 7.12 |
| 21[1] | 14.8 | 685 | 72 | 7.32 |
| Mixture 5, 21 and 23[3] | 22.0 | 670 | 70 | 10.25 |

[1] TiO$_2$ dye-coating from 0.125 mM dye solution + with additive deoxycholic acid 12.5 mM.
[2] TiO$_2$ dye-coating from 0.125 mM dye solution + with additive deoxycholic acid 12.5 mM.
[3] TiO$_2$ dye-coating from a dyes mixture solution (dye 5 0.125 mM, + dye 22 0.125 mM + dye 23 0.375 mM with additive deoxycholic acid 20 mM).

Figure 18:
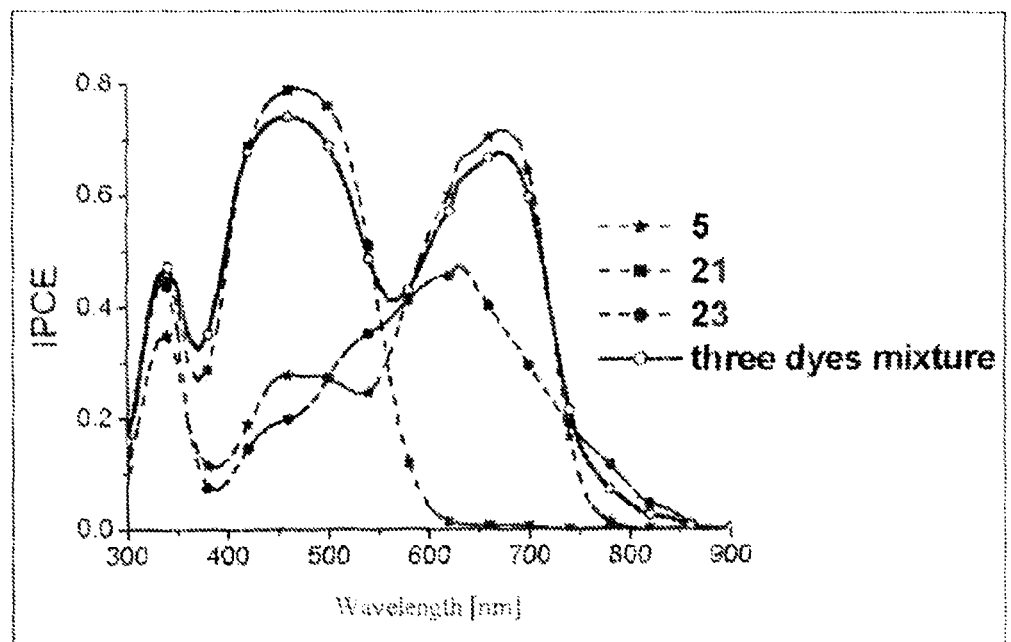
FIG. 18 shows a comparison of the IPCE curves of Mixture 5, dye 21, dye 23 and a mixture of Mixture 5, dye 21, and dye 23.

The three dyes have similar efficiency as single sensitizer. By mixing the dyes higher efficiency of DSSC is achieved. By using a solution in which the dyes are mixed in 1:1:1 ratio the efficiency of the DSSC devise increases. The dyes are photoactive in different regions of solar spectrum. The IPCE curve of the mixture is extended to the red region due to effect of black dye, and is more intense in the range of 580-780 nm due to dye 5 (FIG. 18).

This is the first time that a DSSC with increased efficiency due to employing a mixture of three dyes is reported.

Usually, when two or more dyes are mixed the gain that is achieved by addition of the harvested light by second dye is lost due to a decrease of the performance of the first dye. To show this, three examples that the inventors investigated are disclosed in the following.

In a previous patent application of MSL-Sony WO2005/024866—Tandem cell the inventors disclose the possibility to avoid the loss mentioned above when using two dyes. [6]

In order to have an increase of DSSC efficiency, the device of WO 2005/024866 needs to be built in the "Tandem geometry". In this case the dyes are not mixed, they are coated on two nanoporous layers and used in the device in two separate compartments. For actual mass production, this is a device assembly which is not really economically practicable, because, for mass production, it is a too complicated and costly procedure.

Example 13

Efficiency of M-DSSC containing the organic sensitizer dye 24 and 14 prepared by the method described in Example 6b and measured according to 7a. For comparison also DSSCs with the respective single sensitizer dye were prepared and measured. The dye-solution concentration employed for nanoporous $TiO_2$ coating are the in previous determined optimum concentrations.

| Sensitizer | $J_{SC}$ [mA/cm$^2$] | $V_{OC}$ [mV] | FF [%] | η [%] |
|---|---|---|---|---|
| 14[1] | 8.9 | 675 | 67 | 4.04 |
| 24[2] | 20.4 | 685 | 64 | 8.92 |
| Mixture 14 and 24[3] | 14.1 | 655 | 55 | 4.36 |

[1]$TiO_2$ dye-coating from 0.125 mM dye solution + with additive deoxycholic acid 20 mM.
[2]$TiO_2$ dye-coating from 0.3 mM dye solution + no additive.
[3]$TiO_2$ dye-coating from a dyes mixture solution (dye 14 0.125 mM, + dye 24 0.3 mM + no additive).

It can be clearly seen from the data that by mixing the dyes no higher efficiency of the DSSC device is achieved. This is mainly due to decreased in short current density of the standard sensitizer dye 24 by addition of 14.

Figure 19:
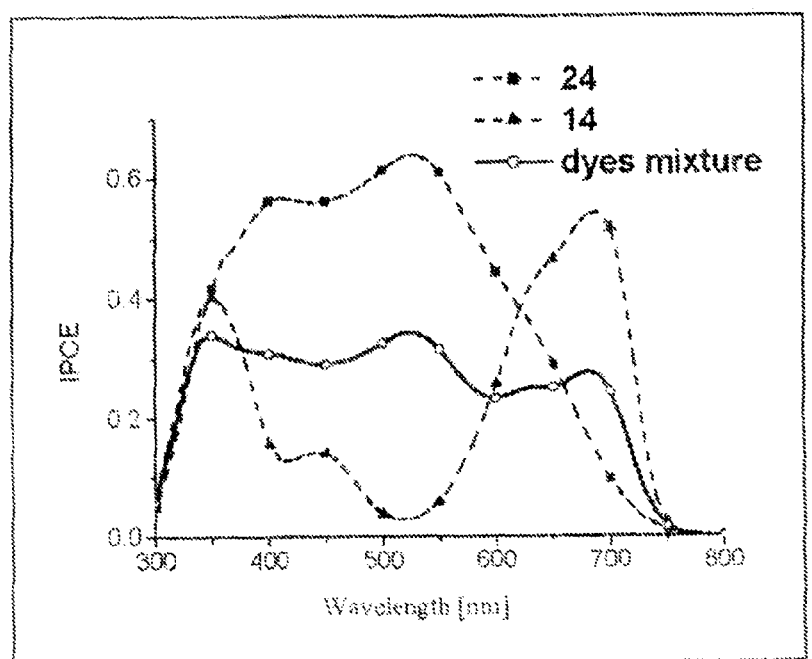
FIG. 19 shows a comparison of the IPCE curves of dye 24, sanitizer dye 14, and a mixture of dye 24 and sanitizer dye 14.

This is confirmed by recording the IPCE curves (FIG. 19). In this case, the red dye 24 alone has a much higher photoactivity when used as single dye than mixed with sensitizer dye 14. There is no additive behavior.

Example 14

Efficiency of M-DSSC containing the organic sensitizer dye 24 and 17 prepared by the method described in Example 6a and measured according to Example 7b. For comparison also DSSCs with the respective single sensitizer dye were prepared and measured. The dye-solution concentration employed for nanoporous $TiO_2$ coating are the in previous determined optimum concentrations.

| Sensitizer | $J_{SC}$ [mA/cm$^2$] | $V_{OC}$ [mV] | FF [%] | η [%] |
|---|---|---|---|---|
| 17[1] | 5.5 | 615 | 69 | 2.30 |
| 24[2] | 24.1 | 700 | 44 | 7.33 |
| dyes mixture[3] | 20.1 | 695 | 52 | 7.32 |

[1]$TiO_2$ dye-coating from 0.3 mM dye solution + with additive deoxycholic acid 20 mM.
[2]$TiO_2$ dye-coating from 0.3 mM dye solution + no additive.
[3]$TiO_2$ dye-coating from a dyes mixture solution (dye 17 0.3 mM, + dye 24 0.3 mM + no additive).

Figure 20:
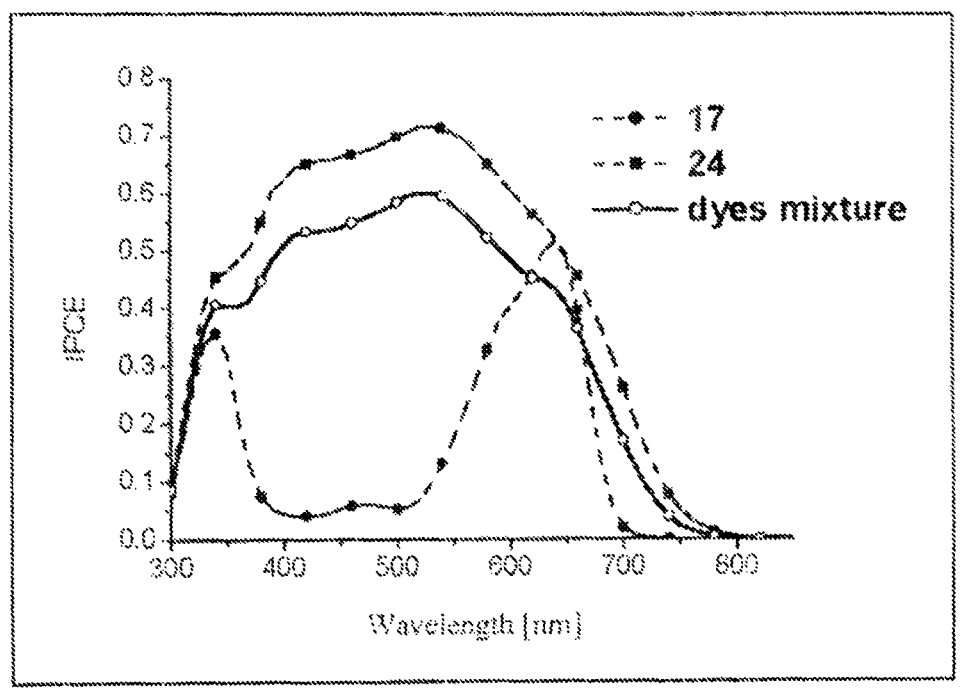
FIG. 20 shows a comparison of the IPCE curves of dye 24, dye 17 and a mixture of dye 24 and dye 17.

By adding dye 17 to standard red dye 24 a decrease in efficiency and IPCE curve is clearly to see (FIG. 20).

Example 15

Efficiency of DSSC by using sensitizer dye 5 and 27 prepared by the method described in Example 6b and measured according to Example 7a.

| Sensitizer | $J_{SC}$ [mA/cm$^2$] | $V_{OC}$ [mV] | FF [%] | η [%] |
|---|---|---|---|---|
| 27[1] | 19.8 | 555 | 57 | 6.25 |
| 5[1] | 29.7 | 556 | 54 | 8.62 |

[1]$TiO_2$ dye-coating from 0.125 mM dye solution + with additive deoxycholic acid 12.5 mM.

Example 16

Efficiency of M-DSSC containing the organic sensitizer dye 24 and 5 prepared by the method described in Example 6b and measured according to Example 7b. For comparison also DSSCs with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 29.7 | 556 | 54 | 8.62 |
| 24[2] | 32.6 | 650 | 41 | 8.83 |
| dyes mixture[3] | 32.6 | 565 | 51 | 9.34 |

[1]$TiO_2$ dye-coating from 0.125 mM dye solution + with additive deoxycholic acid 12.5 mM.
[2]$TiO_2$ dye-coating from 0.3 mM dye solution + no additive.
[3]$TiO_2$ dye-coating from a dyes mixture solution (dye 5 0.125 mM, + dye 24 0.3 mM + 10 mM DCA).

This is the first time that the efficiency of a DSSC increases by using a mixture of standard red dye and an organic dye.

Example 17

Efficiency of DSSCs prepared by the method described in Example 6b and measured according to Example 7b with sensitizer dye 5 and as comparison with other organic sensitizer dye 21 and 22.

| Sensitizer | $J_{SC}$ [mA/cm$^2$] | $V_{OC}$ [mV] | FF [%] | η [%] |
|---|---|---|---|---|
| 5[1] | 14.40 | 648 | 65.2 | 6.09 |
| 21[1] | 8.44 | 716 | 75.6 | 4.57 |
| 22[1] | 10.81 | 648 | 71.7 | 5.02 |

[1]$TiO_2$ dye-coating from 0.125 mM dye solution + with additive deoxycholic acid 12.5 mM.

The dyes 21 and 22 have a similar anchoring group, but they do not have any activity in the long wavelength region of solar spectrum as dye 5.

The efficiency of the DSSC prepared with sensitizer dye 5 has much higher efficiency as the other organic dyes 21 and 22.

6.09% is the highest efficiency ever reported of a DSSC measured under sun simulator illumination and by using an organic dye absorbing light in long wavelength range of solar spectrum >600 nm. All other organic dyes showing good performance in DSSC such as 21 or 22 absorb light in the range of 300-550 nm.

Example 18

Efficiency of DSSCs prepared by the method described in Example 6b and measured according to Example 7b by using individual or mixture of dye 5, 21, 22 and 23. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 14.40 | 648 | 65.2 | 6.09 |
| 21[1] | 8.44 | 716 | 75.6 | 4.57 |
| 22[1] | 10.81 | 648 | 71.7 | 5.02 |
| Mixture 5 and 21[2] | 16.30 | 671 | 66.2 | 7.24 |
| Mixture 5 and 23[2] | 15.06 | 608 | 67.3 | 6.15 |
| Mixture 5, 21 and 23[3] | 16.81 | 652 | 66.6 | 7.30 |

[1] TiO$_2$ dye-coating from 0.125 mM dye solution + with additive deoxycholic acid 12.5 mM.
[2] TiO$_2$ dye-coating from a dyes mixture solution (dye 5 0.125 mM, + dye 21 0.125 mM or dye 23 0.125 mM + additive deoxycholic acid 20 mM).
[3] TiO$_2$ dye-coating from a dyes mixture solution (dye 5 0.125 mM, + dye 21 0.125 mM + dye 23 0.375 mM + additive deoxycholic acid 20 mM).

By using a solution in which the dyes are mixed the efficiency DSSC is increased. This is mostly due to the increased short current density.

Example 19

Synthesis scheme of dye 26 being described in claim 1-5 with trifluoromethyl acrylic acid moiety as anchoring group attached to squarylium dye as a chromophore via a thiophene as conjugated system.

This is an example of the general synthesis scheme depicted in FIG. 1.

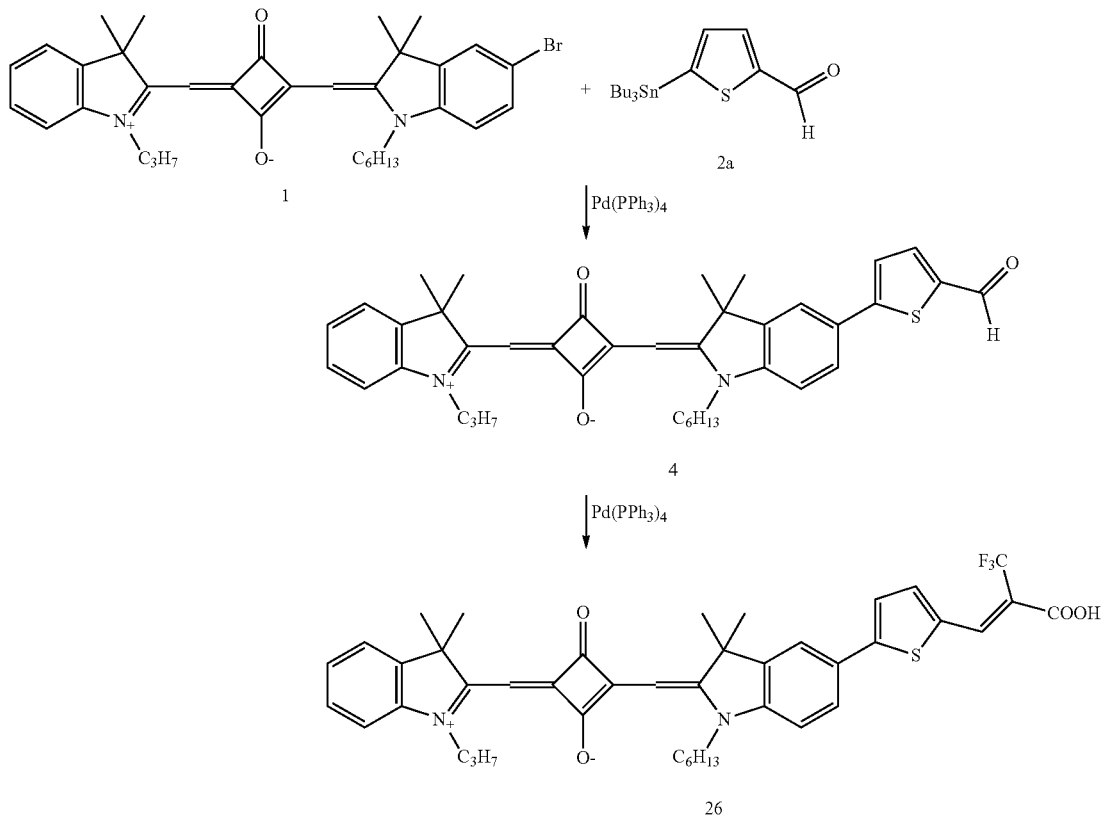

1 is halogenated chromophore
2a is metalated conjugated system comprising a carboxyaldehyde in its structure
step a) Reaction of 1 and 2a by palladium mediated coupling reaction resulting in formation of compound 4; step b) transformation by reaction of 4 with trifluoropropionic acid to the targeted 26.

[1] M. K. Nazeeruddin, A. Kay, I. Rodicio, R. Humphry-Baker, E. Müller, P. Liska, N. Vlachoppoulos, M. Grätzel, *J. Am. Chem. Soc.*, 1993, 115, 6382.
[2] Y. Tachibana, J. E. Moser, M. Grätzel, D. R. Klug, J. R. Durrant, *J. Phys. Chem.* 1996, 100, 20056.
[3] a) T. Horiuchi, H. Miura, S. Uchida, *Chem. Commun.* 2003, 3036; b) K. Sayama, S. Tsukagoshi, K. Hara, Y. Ohga, A. Shinpou, Y. Abe, S. Suga, H. Arakawa, *J. Phys. Chem. B*, 2002, 106, 1363; c) K. Hara, T. Kinoshita, K. Sayama, H. Sugihara, H. Arakawa, *Sol. Energy Mater. Sol. Cells.* 2000, 64, 115.
[4] a) K. G. Thomas, P. V. Kamat, *Acc Chem. Res.* 2003, 36, 888; b) K. Y. Law, Chem. Rev. 1993, 93, 449-486; c) Kim, Sung-Hoon; Han, Sun-Kyung, *High performance squarylium dyes for high-tech use*. Coloration Technology (2001), 117(2), 61-67. d) Chu, et al. Benzpyrylium squarylium and croconylium dyes, and processes for their preparation and use, US1999/065350; e) Satsuki, Makoto; Oga, Yasuyo; Shinpo, Akira; Suga, Sadaharu, Squarylium indole cyanine dyes with good solubility in organic solvents, preparation thereof, and light absorbers therefrom, JP 2002/294094; f) Lin, Tong; Peng, Bi-Xian, *Synthesis and spectral characteristics of some highly soluble squarylium cyanine dyes*, Dyes and Pigments 1997, 35(4), 331-338.

[5] a) K. Hara, T. Sato, R. Katoh, A. Furube, T. Yoshihara, M. Murai, M. Kurashige, S. Ito, A. Shinpo, S. Suga, H. Arakawa, *Adv. Funct. Mater.* 2005, 15, 246; b) K. Hara, Z. Wang, T. Sato, A. Furube, R. KAtoh, H. Sugihara, Y. Danoh, A. Shinpo, S. Suga, *J. Phys. Chem* 2005, 109, 15476.

[6] WO2005/024866, Michael Duerr et al.

The invention claimed is:

1. A dye represented by formula I

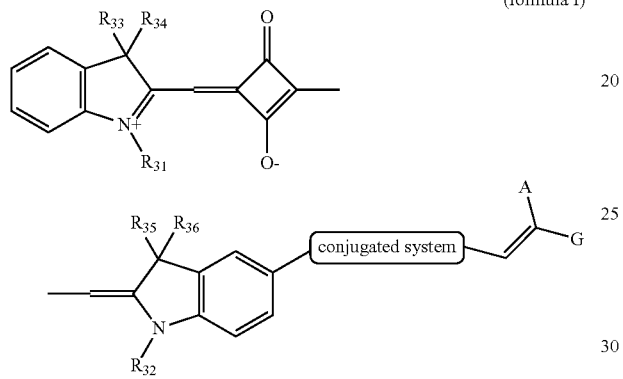

(formula I)

wherein G is an anchoring group, said anchoring group allowing a covalent coupling of said dye to a surface, said anchoring group being selected from —COOH, —SO$_3$H, —PO$_3$H$_2$, —BO$_2$H$_2$, —SH, —OH, and —NH$_2$, wherein A is selected from the group consisting of H, —CN, —NO$_2$, —COOR, —COSR, —COR, —CSR, —NCS, —CF$_3$, —CONR$_2$, —OCF$_3$, and C$_6$H$_{5-m}$F$_m$, in which m=1-5, and R is H or any straight or branched alkyl chain of general formula —C$_n$H$_{2n+1}$, in which n=0-12, wherein R$_{31}$, R$_{32}$, R$_{33}$, R$_{34}$, R$_{35}$, R$_{36}$, at each occurrence, are independently selected from H or any straight or branched chain of general formula —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, and —((CH$_2$)$_p$—O)$_n$—CH$_3$, in which n=0-12, p=1-4, and R is as defined above, or any substituted or non-substituted phenyl or biphenyl, wherein said conjugated system is represented by a moiety shown in formula II

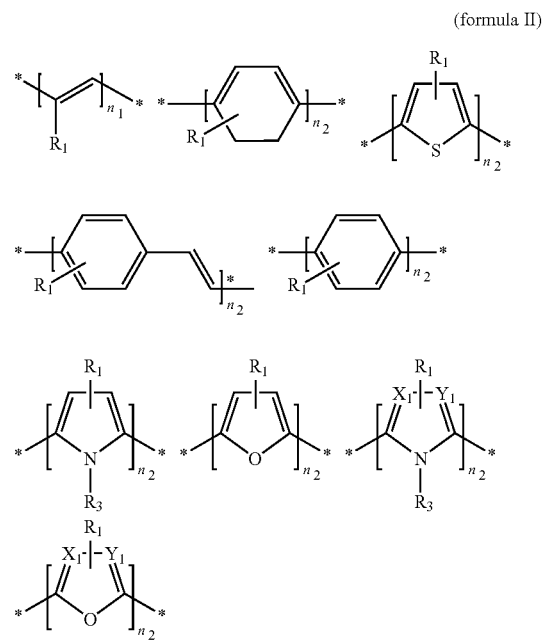

(formula II)

or a combination of any of the moieties represented by formula II, in which n$_1$ and n$_2$=1-12, wherein R$_3$ is selected from H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, and —((CH$_2$)$_p$—O)$_n$—CH$_3$, in which p=1-4, n=0-12, and R is as defined above, and R$_1$ is selected from halogen or NO$_2$, NH$_2$, CN, SO$_3$H, OH, H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, and —((CH$_2$)$_p$—O)$_n$—CH$_3$, in which p=1-4, n=0-12, and R is as defined above.

2. The dye according to claim 1, being able to absorb in the wavelength range of visible and/or IR light, or a subrange thereof.

3. The dye according to claim 1, having the formula III

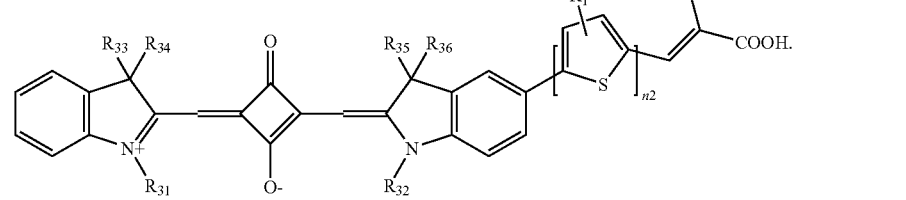

(formula III)

4. The dye according to claim 1, having the formula IV
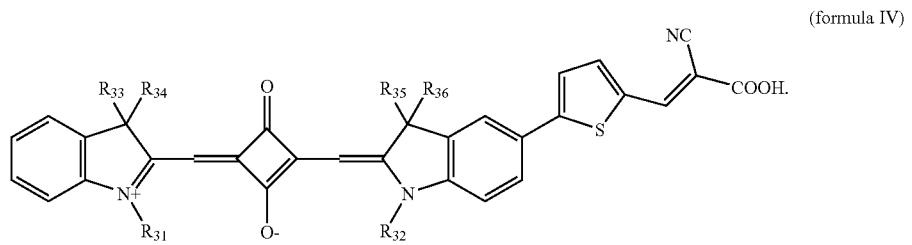
(formula IV)
5. The dye according to claim 1, having the formula V
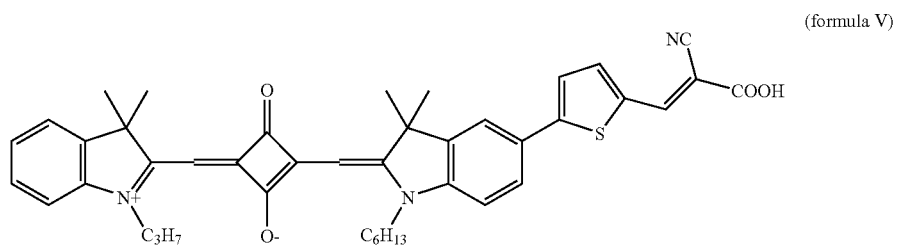
(formula V)
or formula VI
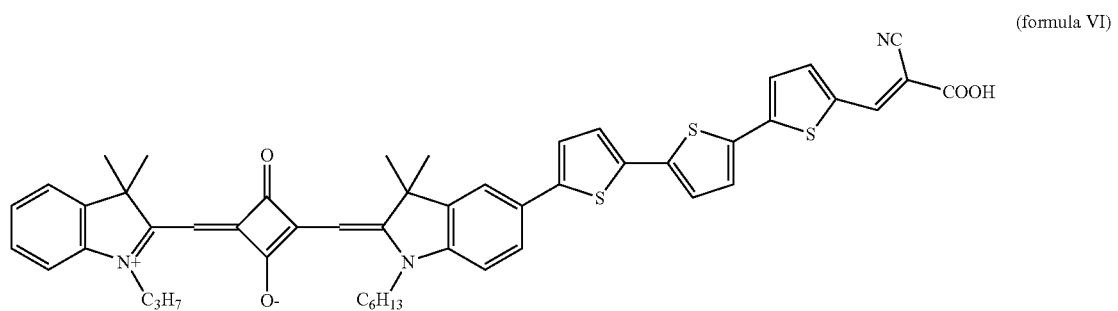
(formula VI)
or formula VII
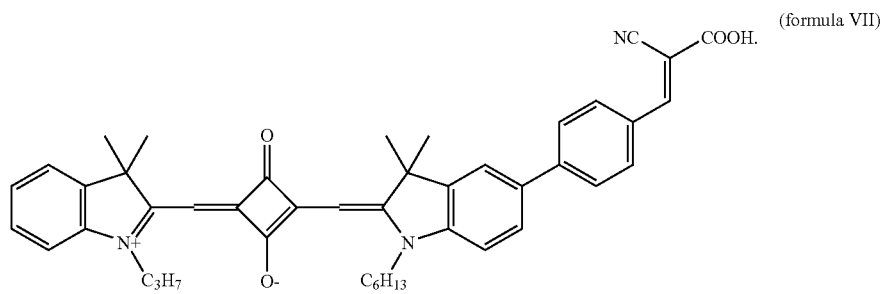
(formula VII)

6. A method of synthesis of a dye according to claim 1, comprising:

a) coupling a halogenated squarylium dye and a metalated conjugated system comprising a carboxyaldehyde moiety in its structure, as represented by the scheme I

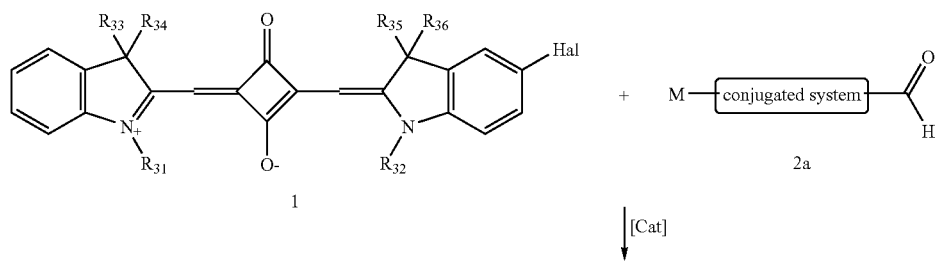

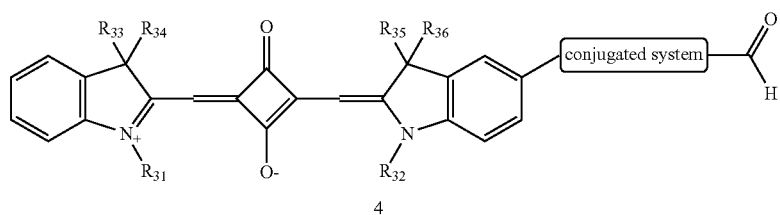

wherein

Hal=Br, I, Cl, or Tosyl

M=Sn(alkyl)$_3$, B(OR)$_2$, MgHal, or ZnR$_2$, in which R is in this case an H or any alkyl group, R$_{31}$-R$_{36}$ and said conjugated system are as defined claim 1, and

[Cat] represents a generally employed catalyst in such transition metal catalyzed coupling reactions, and wherein 1 is a halogenated squarylium dye and 2a is a metalated conjugated system comprising a carboxyaldehyde moiety in its structure or coupling a metalated squarylium dye and a halogenated conjugated system comprising a carboxyaldehyde moiety in its structure, as represented by the scheme II

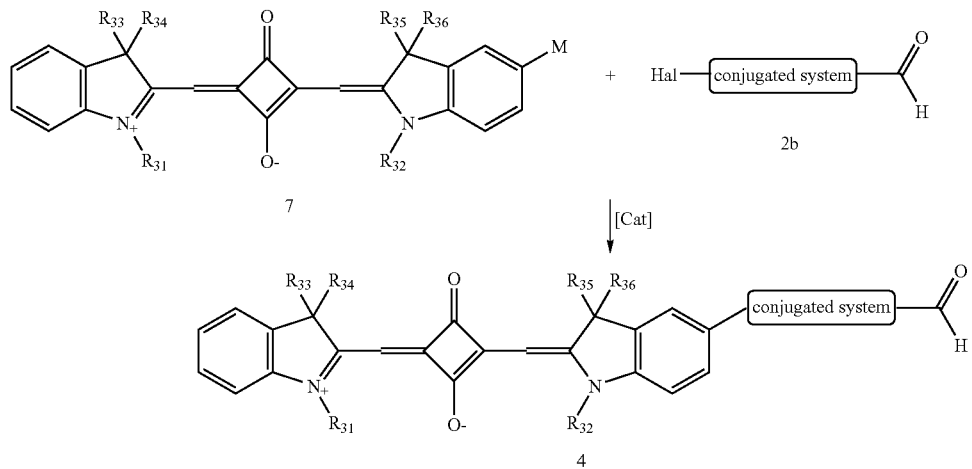

wherein
Hal=Br, I, Cl, or Tosyl
M=Sn(alkyl)$_3$, B(OR)$_2$, MgHal, or ZnR$_2$, in which R is in this case an H or any alkyl group, $R_{31}$-$R_{36}$ and said conjugated system are as defined in claim 1,
[Cat] represents a generally employed catalyst in such transition metal catalyzed coupling reactions, and wherein 7 is a metalated squarylium dye and 2b is a halogenated conjugated system comprising a carboxy-aldehyde moiety in its structure, and b) condensing the product of a), with a reagent of general formula A-CH$_2$-G, as represented by the scheme III

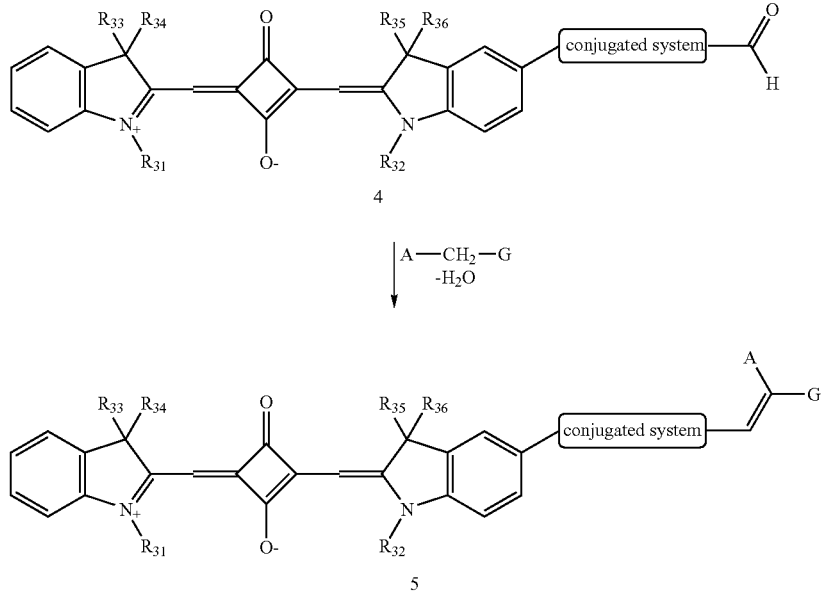

wherein G, A, $R_{31}$-$R_{36}$ and said conjugated system are as defined in claim 1.

7. A method of synthesis of a dye according to claim 1, comprising:
a) coupling a halogenated squarylium dye and a metalated conjugated system as represented by the scheme IV

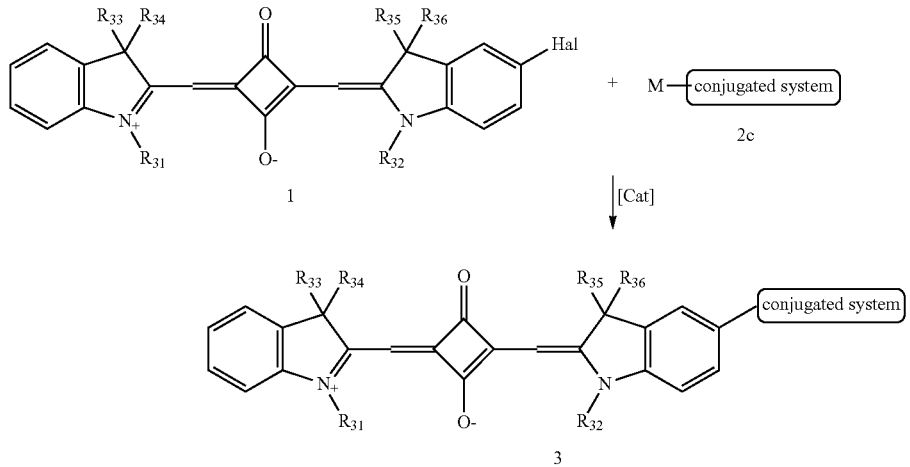

wherein
Hal=Br, I, Cl, or Tosyl
M=Sn(alkyl)$_3$, B(OR)$_2$, MgHal, or ZnR$_2$, in which R is in this case an H or any alkyl group, $R_{31}$-$R_{36}$ and said conjugated system are as defined in claim 1, and
[Cat] represents a generally employed catalyst in such transition metal catalyzed coupling reactions, and wherein 1 is a halogenated squarylium dye and 2c is a metalated conjugated system comprising a carboxyaldehyde moiety in its structure or coupling a metalated squarylium dye and a halogenated conjugated system, as represented by the scheme V

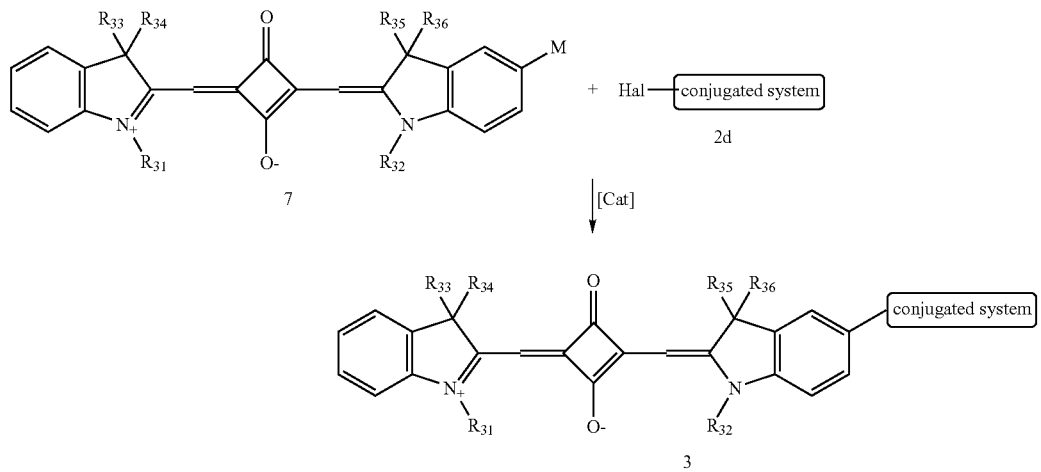

wherein
Hal=Br, I, Cl, or Tosyl
M=Sn(alkyl)$_3$, B(OR)$_2$, MgHal, or ZnR$_2$, in which R is in this case an H or any alkyl group, $R_{31}$-$R_{36}$ and said conjugated system are as defined in claim 1, and
[Cat] represents a generally employed catalyst in such transition metal catalyzed coupling reactions,
and wherein 1 is a metalated squarylium dye and 2c is a halogenated conjugated system
b) introducing a carboxyaldehyde moiety to the product of reaction a) by a reaction represented by the scheme VI

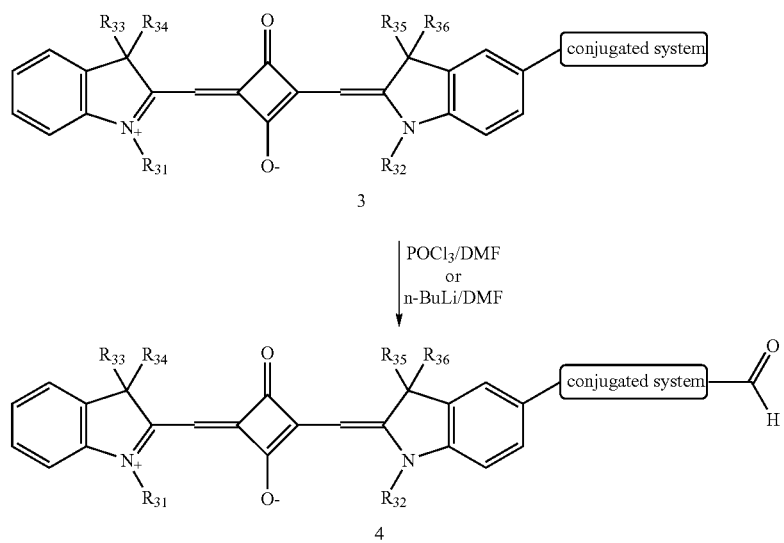

wherein G, A, $R_{31}$-$R_{36}$ and said conjugated system are as defined in claim 1, and c) condensing the product of b), with a reagent of general formula A-CH$_2$-G, as represented by the scheme VII wherein Hal=Br, I, Cl, or Tosyl R is any alkyl group, and $R_{31}$, $R_{33}$ and $R_{34}$ are as defined in claim 1, and b1) deprotecting the alkyl ester to a hydroxyl group, as represented by scheme IX

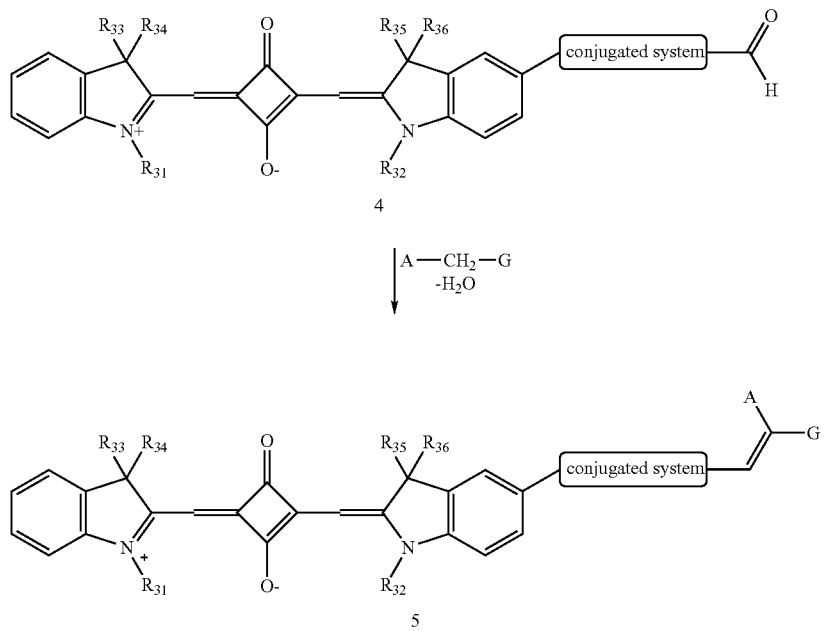

wherein G, A, $R_{31}$-$R_{36}$ and said conjugated system are as defined claim 1.

8. A method of synthesis of a halogenated squarylium dye 1 as defined in claim 6 comprising:

a) forming a halo or alkyl ester of a squaric acid derivative 1c, as represented by Scheme VIII

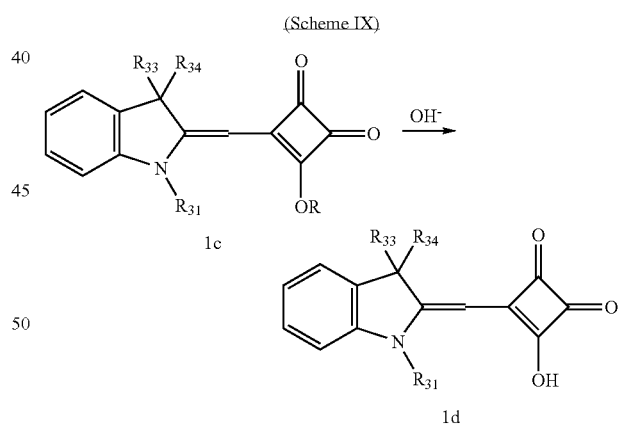

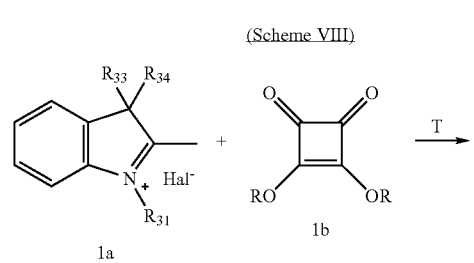

followed subsequently by a condensation reaction between intermediate 1d and compound 1e, as represented by Scheme X

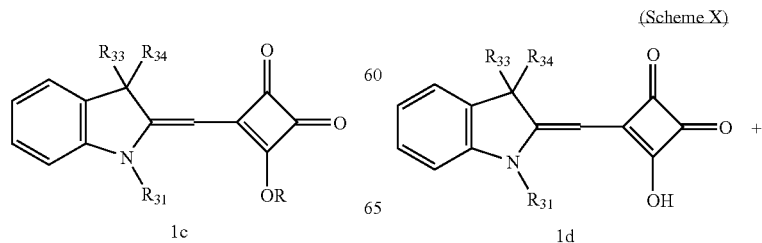

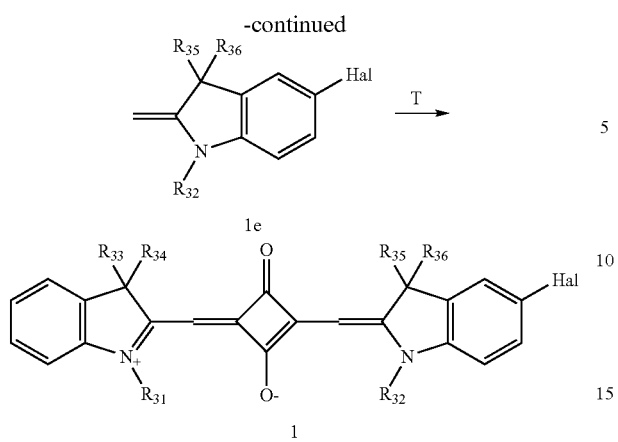

or
b2) reacting directly the product from a) and compound 1e, as represented by Scheme XI

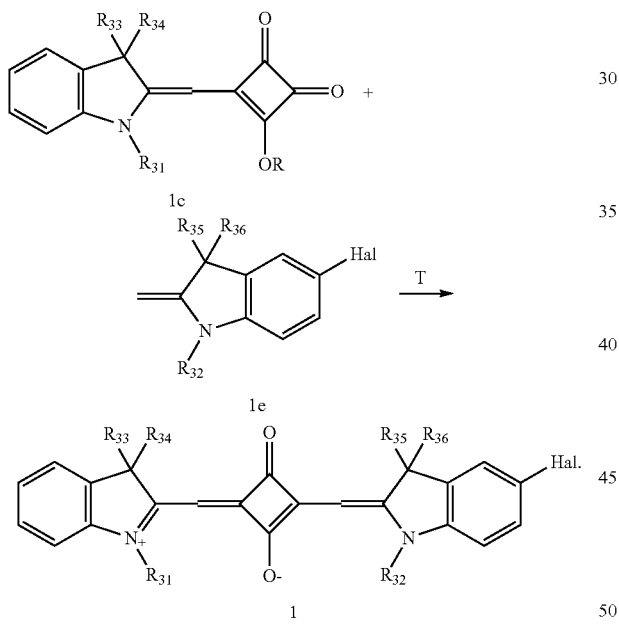

9. An electronic device comprising a dye represented by formula I wherein G is an anchoring group, said anchoring group allowing a covalent coupling of said dye to a surface, said anchoring group being selected from —COOH, —SO$_3$H, —PO$_3$H$_2$, —BO$_2$H$_2$, —SH, —OH, and —NH$_2$, wherein A is selected from the group consisting of H, —CN, —NO$_2$, —COOR, —COSR, —COR, —CSR, —NCS, —CF$_3$, —CONR$_2$—OCF$_3$, and C$_6$H$_{5-m}$F$_m$, in which m=1-5, and R is H or any straight or branched alkyl chain of general formula —C$_n$H$_{2n+1}$, in which n=0-12, wherein R$_{31}$, R$_{32}$, R$_{33}$, R$_{34}$, R$_{35}$, R$_{36}$, at each occurrence, are independently selected from H or any straight or branched chain of general formula —(CH$_2$)$_n$CH$_3$, —(CH$_2$)$_n$—COOR, —(CH$_2$)$_n$OR, —(CH$_2$)$_n$—SR, —(CH$_2$)$_n$—NR$_2$, and —((CH$_2$)$_p$—O)$_n$—CH$_3$, in which n=0-12, p=1-4, and R is as defined above, or any substituted or non-substituted phenyl or biphenyl, wherein said conjugated system is represented by a moiety shown in formula II

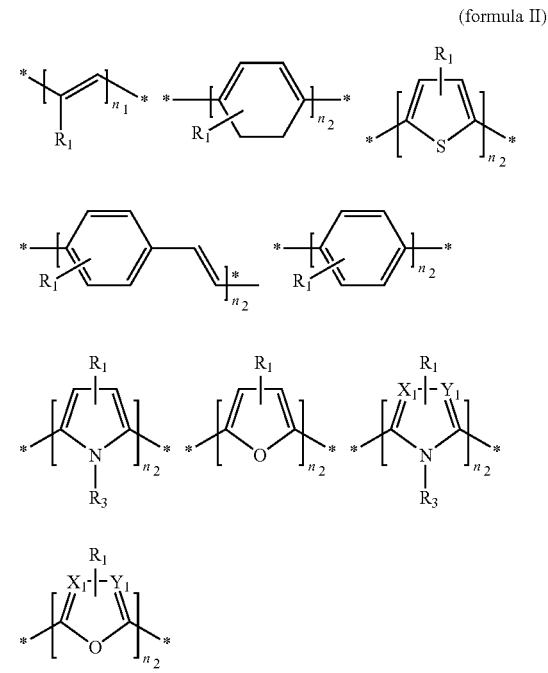

or a combination of any of the moieties represented by formula II,

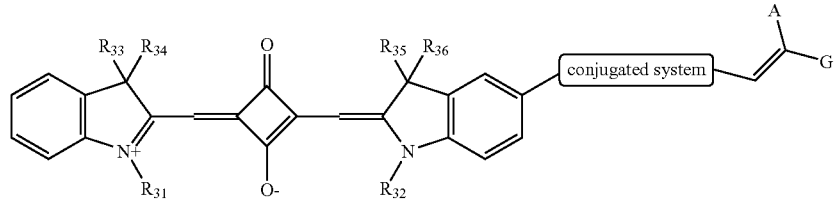

in which $n_1$ and $n_2$=1-12, wherein $R_3$ is selected from

H, —$(CH_2)_nCH_3$, —$(CH_2)_n$—COOR, —$(CH_2)_n$—OR, —$(CH_2)_n$—SR,

—$(CH_2)_n$—$NR_2$, and —$((CH_2)_p$—$O)_n$—$CH_3$, in which p=1-4, n=0-12, and R is as defined above, and $R_1$ is selected from halogen or $NO_2$, $NH_2$, CN, $SO_3H$, OH, H, —$(CH_2)_nCH_3$, —$(CH_2)_n$—COOR, —$(CH_2)_n$—OR, —$(CH_2)_nSR$, —$(CH_2)_n$—$NR_2$, and —$((CH_2)_p$—$O)_n$—$CH_3$, in which p=1-4, n=0-12, and R is as defined above.

10. The device according to claim 9, which is a solar cell.

11. The device according to claim 10, wherein said solar cell is a dye-sensitized solar cell, and said dye is chemisorbed to a photoactive semiconductor porous material in said dye-sensitized solar cell.

12. The device according to claim 9, further comprising at least one other dye.

13. The device according to claim 12, wherein said at least one other dye is a red-dye or a black-dye or a combination of the two.

14. The device according to claim 9, wherein said dye is present in solution or wherein said dye is present in a film.

15. A sensitizer in a dye-sensitized solar cell comprising a dye represented by formula I

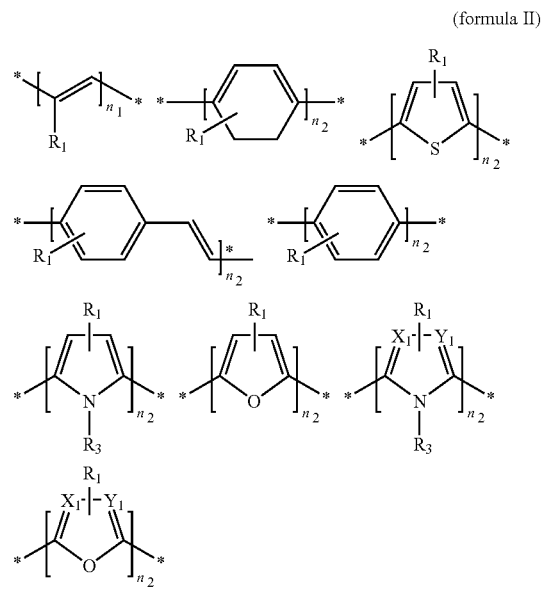

(formula II)

or a combination of any of the moieties represented by formula II,

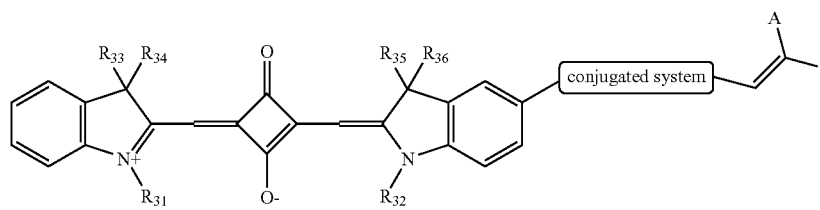

(formula I)

wherein G is an anchoring group, said anchoring group allowing a covalent coupling of said dye to a surface, said anchoring group being selected from —COOH, —$SO_3H$, —$PO_3H_2$, —$BO_2H_2$, —SH, —OH, and —$NH_2$, wherein A is selected from the group consisting of H, —CN, —COOR, —COSR, —COR, —CSR, —NCS, —$CF_3$, —$CONR_2$—$OCF_3$, and $C_6H_{5-m}F_m$, in which m=1-5, and R is H or any straight or branched alkyl chain of general formula —$C_nH_{2n+1}$, in which n=0-12, wherein $R_{31}$, $R_{32}$, $R_{33}$, $R_{34}$, $R_{35}$, $R_{36}$, at each occurrence, are independently selected from H or any straight or branched chain of general formula —$(CH_2)_nCH_3$, —$(CH_2)_n$—COOR, —$(CH_2)_n$—OR, —$(CH_2)_n$—SR, —$(CH_2)_n$—$NR_2$, and —$((CH_2)_p$—$O)_n$—$CH_3$, in which n=0-12, p=1-4, and R is as defined above, or any substituted or non-substituted phenyl or biphenyl, wherein said conjugated system is represented by a moiety shown in formula II in which $n_1$ and $n_2$=1-12, wherein $R_3$ is selected from H, —$(CH_2)_nCH_3$, —$(CH_2)_n$—COOR, —$(CH_2)_n$—OR, —$(CH_2)_n$—SR, —$(CH_2)_n$—$NR_2$, and —$((CH_2)_p$—$O)_n$—$CH_3$, in which p=1-4, n=0-12, and R is as defined above, and $R_1$ is selected from halogen or $NO_2$, $NH_2$, CN, $SO_3H$, OH, H, —$(CH_2)_nCH_3$, —$(CH_2)_n$—COOR, —$(CH_2)_n$—OR, —$(CH_2)_n$—SR, —$(CH_2)_n$—$NR_2$, and —$((CH_2)_p$—$O)_n$—$CH_3$, in which p=1-4, n=0-12, and R is as defined above.

16. The sensitizer according to claim 15, together with at least one other dye.

17. A sensitizer of claim 15 further comprising at least one other dye, wherein said at least one other dye is a red-dye or a black-dye or a combination of the two.

* * * * *